(12) United States Patent
Willenegger et al.

(10) Patent No.: US 7,177,658 B2
(45) Date of Patent: Feb. 13, 2007

(54) MULTI-MEDIA BROADCAST AND MULTICAST SERVICE (MBMS) IN A WIRELESS COMMUNICATIONS SYSTEM

(75) Inventors: Serge Willenegger, Onnens (CH); Tao Chen, San Diego, CA (US); Alkinoos Hector Vayanos, San Diego, CA (US); Yongbin Wei, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 727 days.

(21) Appl. No.: 10/140,352

(22) Filed: May 6, 2002

(65) Prior Publication Data

US 2003/0207696 A1 Nov. 6, 2003

(51) Int. Cl.
*H04B 7/00* (2006.01)
*H04Q 7/20* (2006.01)

(52) U.S. Cl. .................. 455/522; 455/69; 455/13.4; 455/574; 455/464; 455/63.3; 370/336; 370/334; 370/442; 370/470; 375/222; 375/240.24

(58) Field of Classification Search ........... 455/522, 455/526, 464, 564, 574, 63.3, 69, 13.4; 370/336, 370/337, 334, 442, 443, 470, 464, 322, 390, 370/392; 375/222, 240.24
See application file for complete search history.

(56) References Cited

U.S. PATENT DOCUMENTS

| | | | |
|---|---|---|---|
| 5,709,541 A | * | 1/1998 | Gensler et al. ............ 431/10 |
| 6,091,777 A | * | 7/2000 | Guetz et al. ............ 375/240.11 |
| 6,353,637 B1 | * | 3/2002 | Mansour et al. ............ 375/260 |
| 6,804,223 B2 | * | 10/2004 | Hoffmann et al. .......... 370/342 |
| 2002/0009061 A1 | | 1/2002 | Willenegger |
| 2003/0035389 A1 | | 2/2003 | Chen et al. |
| 2003/0036384 A1 | | 2/2003 | Chen et al. |
| 2003/0036403 A1 | | 2/2003 | Shiu et al. |
| 2003/0072384 A1 | | 4/2003 | Chen et al. |
| 2003/0106008 A1 | | 6/2003 | Butler et al. |
| 2003/0114177 A1 | | 6/2003 | Sinnarajah et al. |
| 2003/0134655 A1 | | 7/2003 | Chen et al. |
| 2003/0139140 A1 | | 7/2003 | Chen et al. |

* cited by examiner

*Primary Examiner*—Tilahun Gesesse
*Assistant Examiner*—Shaima Q. Aminzay
(74) *Attorney, Agent, or Firm*—Philip R. Wadsworth; Thien T. Nguyen; S. Hossain Beladi

(57) ABSTRACT

Techniques to implement MBMS services in a wireless communication system. In one aspect, a method is provided for processing data for transmission to a plurality of terminals. Frames of information bits (which may have variable rates) are provided to a buffer implementing a matrix. The matrix is padded with padding bits based on a particular padding scheme to support variable frame rates. The frames are then coded based on a particular block code to provide parity bits. The frame of information bits and the parity bits are then transmitted to the terminals. In another aspect, a method is provided for controlling the transmit power of a data transmission to a plurality of terminals. In accordance with the method, TPC streams are received from the terminals and processed to obtain a stream of joint power control commands used to adjust the transmit power of the data transmission.

13 Claims, 13 Drawing Sheets

MULTI-MEDIA BROADCAST AND MULTICAST SERVICE (MBMS) IN A WIRELESS COMMUNICATIONS SYSTEM

BACKGROUND

1. Field

The present invention relates generally to data communication, and more specifically to techniques for implementing multi-media broadcast and multicast service (MBMS) in a wireless communication system.

2. Background

Wireless communication systems are widely deployed to provide various types of communication such as voice, data, and so on. These systems may be multiple-access systems capable of supporting communication for multiple users and may be based on code division multiple access (CDMA), time division multiple access (TDMA), frequency division multiple access (FDMA), or some other multiple access techniques. CDMA systems may provide certain advantages over other types of system, including increased system capacity.

A wireless communication system may be designed to provide various types of services. These services may include point-to-point services, or dedicated services such as voice and packet data, whereby data is transmitted from a transmission source (e.g., a base station) to a specific recipient terminal. These services may also include point-to-multipoint services, or broadcast services such as news, whereby data is transmitted from a transmission source to a number of recipient terminals.

The characteristics and requirements for broadcast services are very different in many aspects from those for dedicated services. For example, dedicated resources (e.g., physical channels) may be required to be allocated to individual terminals for dedicated services. In contrast, common resources may be allocated and used for all terminals expected to receive the broadcast services. Moreover, the transmission for a broadcast service would need to be controlled such that a large number of terminals are able to reliably receive the service, while minimizing the amount resources required to implement the service.

There is therefore a need in the art for techniques to implement MBMS services, which comprise broadcast and multicast services, in a wireless communication system.

SUMMARY

Techniques are provided herein to implement MBMS services in a wireless communication system. These techniques cover various aspects of point-to-multipoint transmissions for broadcast and multicast services.

In one aspect, a method is provided for processing data for transmission to a plurality of terminals (or UEs). In accordance with the method, a plurality of frames of information bits is provided to a buffer implementing a matrix. The frames may have variable rates and each frame may include a particular number of information bits that is different from those of other frames provided to the matrix. The matrix is padded with padding bits based on a particular padding scheme to support variable rates for the frames. The frames of information bits are then coded based on a particular (block) code to provide a plurality of parity bits. The frames of information bits and the parity bits are then transmitted to the terminals.

In another aspect, a method is provided for controlling the transmit power of a (broadcast or multicast) data transmission to a plurality of terminals. In accordance with the method, a plurality of uplink transmit power control (TPC) streams is received from the terminals. The uplink TPC streams are then processed to obtain a stream of joint power control commands for the data transmission. The transmit power of the data transmission is then adjusted based on the stream of joint power control commands.

In one embodiment, a single uplink TPC stream is received from each terminal. The single uplink TPC stream would include power control commands for controlling transmit powers of multiple downlink data transmissions to the terminal, one of which is the (broadcast or multicast) data transmission to the plurality of terminals. In an embodiment, the single uplink TPC stream from each terminal includes a power control command for each power control interval, which is set to increase transmit power if an increase in transmit power is needed for any of the multiple downlink data transmissions. The joint power control command for each power control interval may then be determined based an "OR-of-the-UP" commands in the uplink TPC streams received from the terminals for that power control interval.

A downlink TPC stream is also typically transmitted for each terminal. The downlink TPC streams for the plurality of terminals may be transmitted in a multiplexed (e.g., time-division multiplexed) manner on a single power control channel.

Various aspects and embodiments of the invention are described in further detail below. The invention further provides methods, program codes, digital signal processors, receiver units, transmitter units, terminals, base stations, systems, and other apparatuses and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Techniques are described herein to implement a multi-media broadcast and multi-cast service (MBMS) in a wireless communication system. MBMS comprises point-to-multipoint communication services that attempt to deliver certain content to a large number of user terminals (i.e., broadcast) and services that attempt to deliver certain content to a specific group of user terminals (i.e., multicast). The design considerations for MBMS are different from those of point-to-point communication services (such as voice and packet data), which are commonly provided by cellular communication systems. Various considerations and design features for MBMS are described in detail below.

A. System

Figure 1:
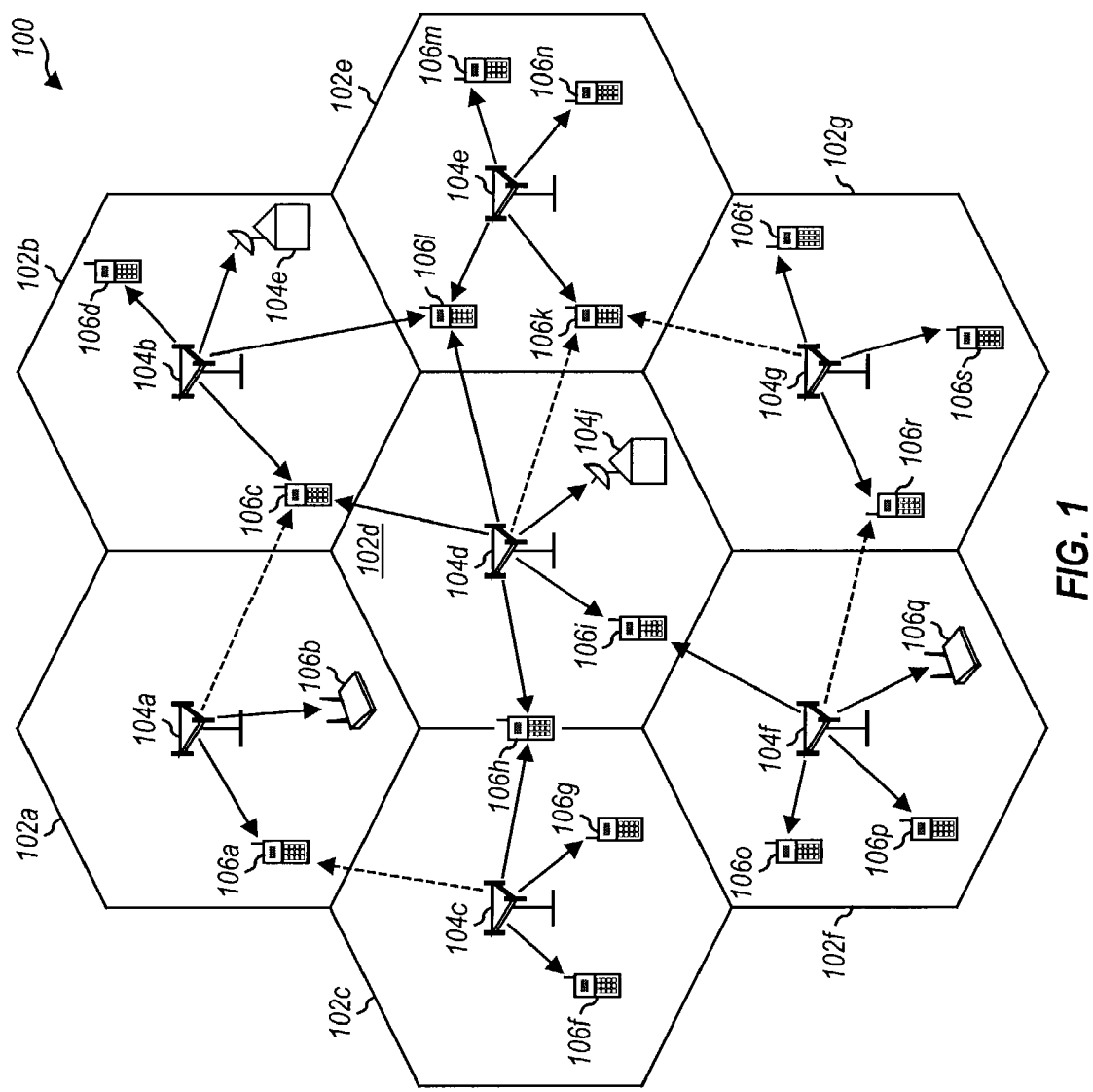
FIG. 1 is a diagram of a wireless communication system that may implement various aspects and embodiments of MBMS.

FIG. 1 is a diagram of a wireless communication system 100 that may implement various aspects and embodiments of MBMS. System 100 includes a number of base stations 104 that provide coverage for a number of geographic regions 102. A base station is also referred to as a base transceiver system (BTS), an access point, a Node B, or some other terminology. The base station is part of the UMTS Radio Access Network (UTRAN). A base station and/or its coverage area are also often referred to as a cell, depending on the context in which the term is used.

As shown in FIG. 1, various terminals 106 are dispersed throughout the system. A terminal is also referred to as a mobile station, user equipment (UE), or some other terminology. Each terminal 106 may communicate with one or more base stations 104 on the downlink and uplink at any given moment, depending on whether or not the terminal is active and whether or not it is in soft hand-over. The downlink (i.e., forward link) refers to transmission from the base station to the terminal, and the uplink (i.e., reverse link) refers to transmission from the terminal to the base station.

In the example shown in FIG. 1, base station 104a transmits to terminals 106a and 106b on the downlink, base station 104b transmits to terminals 106c, 106d, 106e, and 106l, and so on. Terminal 106c is in soft hand-over and receives transmissions from base stations 104b and 104d. In FIG. 1, a solid line with an arrow indicates a user-specific (or dedicated) data transmission from the base station to the terminal. A broken line with an arrow indicates that the terminal is receiving pilot, signaling, and possibly MBMS services, but no user-specific data transmission from the base station. The uplink communication is not shown in FIG. 1 for simplicity.

MBMS as described herein may be implemented in various wireless communication systems. Such systems may include code division multiple access (CDMA), time division multiple access (TDMA), and frequency division multiple access (FDMA) communication systems. CDMA systems may be designed to implement one or more commonly known CDMA standards such as W-CDMA, IS-95, IS-2000, IS-856, and others. For clarity, various implementation details for MBMS are described for a W-CDMA system.

Figure 2:
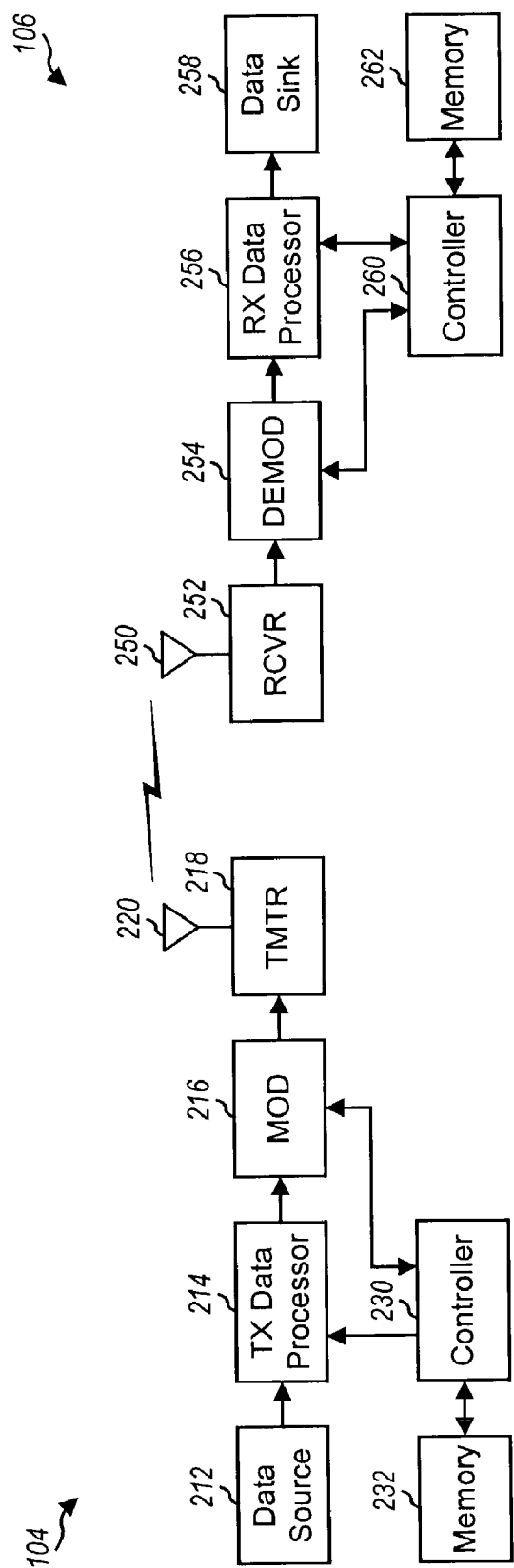
FIG. 2 is a simplified block diagram of an embodiment of a base station and a terminal (or UE)

FIG. 2 is a simplified block diagram of an embodiment of a base station 104 and a terminal 106. On the downlink, at base station 104, a transmit (TX) data processor 214 receives different types of traffic such as user-specific data and data for MBMS services from a data source 212, messages from a controller 230, and so on. TX data processor 214 then formats and codes the data and messages based on one or more coding schemes to provide coded data.

The coded data is then provided to a modulator (MOD) 216 and further processed to generate modulated data. For W-CDMA, the processing by modulator 216 includes (1) "spreading" the coded data with orthogonal variable spreading factor (OVSF) codes to channelize the user-specific data, MBMS data, and messages onto physical channels and (2) "scrambling" the channelized data with scrambling codes. The modulated data is then provided to a transmitter (TMTR) 218 and conditioned (e.g., converted to one or more analog signals, amplified, filtered, and quadrature modulated) to generate a downlink modulated signal suitable for transmission via an antenna 220 over a wireless communication channel to the terminals.

At terminal 106, the downlink modulated signal is received by an antenna 250 and provided to a receiver (RCVR) 252. Receiver 252 conditions (e.g., filters, amplifies, and downconverts) the received signal and digitizes the conditioned signal to provide data samples. A demodulator (DEMOD) 254 then receives and processes the data samples to provide recovered symbols. For W-CDMA, the processing by demodulator 254 includes (1) descrambling the data samples with the same scrambling code used by the terminal, (2) despreading the descrambled samples to channelize the received data and messages onto the proper physical channels, and (3) (possibly) coherently demodulating the channelized data with a pilot recovered from the received signal. A receive (RX) data processor 256 then receives and decodes the symbols to recover the user-specific data, MBMS data, and messages transmitted by the base station on the downlink.

Controllers 230 and 260 control the processing at the base station and the terminal, respectively. Each controller may also be designed to implement all or a portion of the process to select transport format combinations for use described herein. Program codes and data required by controllers 230 and 260 may be stored in memories 232 and 262, respectively.

Figure 3:
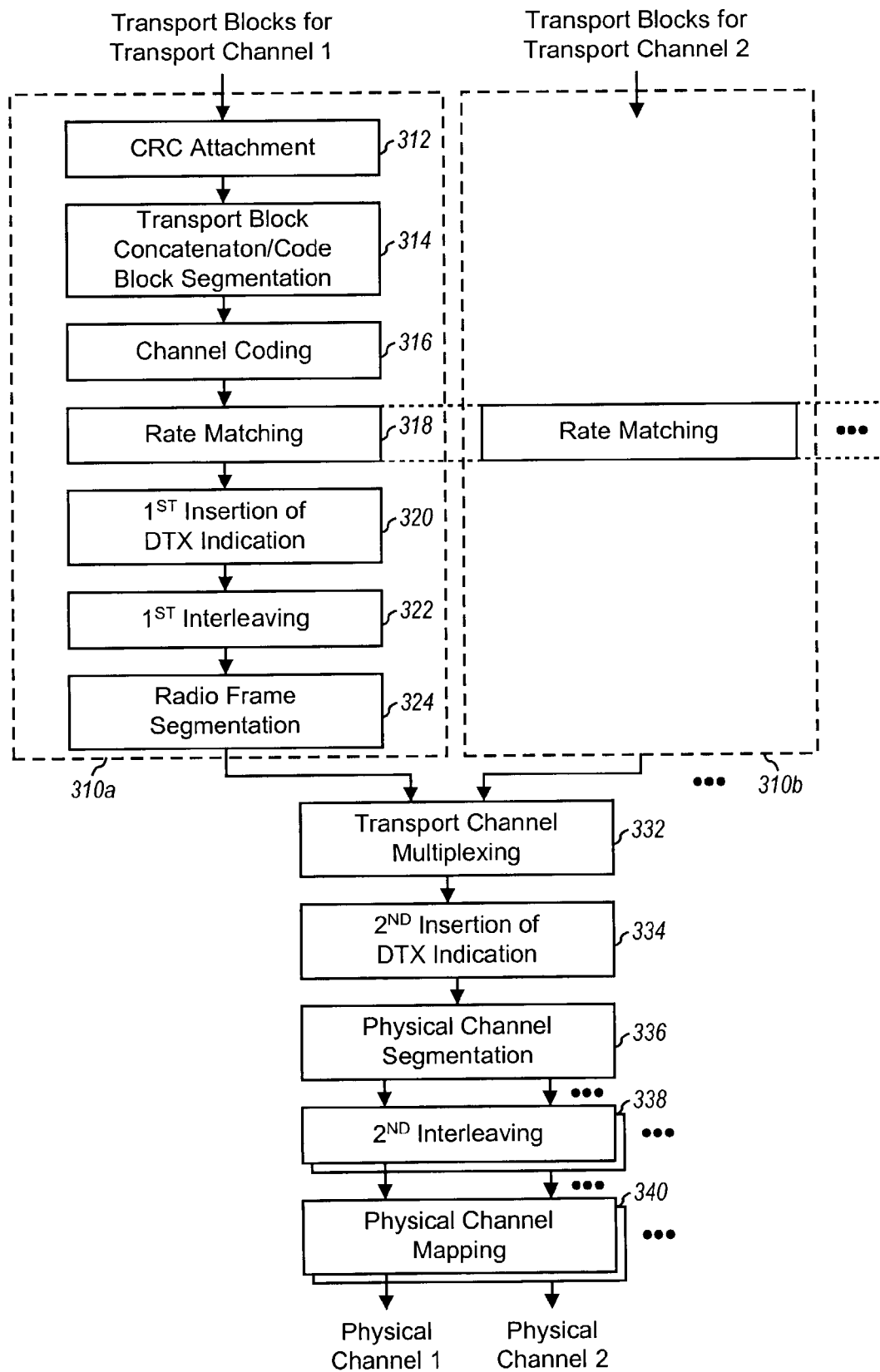
FIG. 3 is a diagram of the signal processing at the base station for a downlink data transmission, in accordance with W-CDMA.

FIG. 3 is a diagram of the signal processing at a base station for a downlink data transmission, in accordance with W-CDMA. The upper signaling layers of a W-CDMA system support data transmission on one or more transport channels to a specific terminal (or for a specific MBMS service). Each transport channel is capable of carrying data for one or more services. These services may include voice, video, packet data, and so on, which are collectively referred to herein as "data". The data to be transmitted is initially processed as one or more transport channels at a higher signaling layer. The transport channels are then mapped to one or more physical channels assigned to the terminal (or MBMS service).

The data for each transport channel is processed based on a transport format (TF) selected for that transport channel (a single TF is selected at any given moment). Each transport format defines various processing parameters such as a transmission time interval (TTI) over which the transport format applies, the size of each transport block of data, the number of transport blocks within each TTI, the coding scheme to be used for the TTI, and so on. The TTI may be specified as 10 msec, 20 msec, 40 msec, or 80 msec. Each TTI may be used to transmit a transport block set having $N_B$ equal-sized transport blocks, as specified by the transport format for the TTI. For each transport channel, the transport format can dynamically change from TTI to TTI, and the set of transport formats that may be used for the transport channel is referred to as the transport format set (TFS).

As shown in FIG. 3, the data for each transport channel is provided, in one or more transport blocks for each TTI, to a respective transport channel processing section 310. Within each processing section 310, each transport block is used to calculate a set of cyclic redundancy check (CRC) bits (block 312). The CRC bits are attached to the transport block and are used at the terminal for block error detection. The one or more CRC coded blocks for each TTI are then serially concatenated together (block 314). If the total number of bits after concatenation is greater than the maximum size of a code block, then the bits are segmented into a number of (equal-sized) code blocks. The maximum code block size is determined by the particular coding scheme (e.g., convolutional, Turbo, or no coding) selected for use for the current TTI, which is specified by the transport channel's transport format for the TTI. Each code block is then coded with the selected coding scheme or not coded at all (block 316) to generate coded bits.

Rate matching is then performed on the coded bits in accordance with a rate-matching attribute assigned by higher signaling layers and specified by the transport format (block 318). On the downlink, unused bit positions are filled with discontinuous transmission (DTX) bits (block 320). The DTX bits indicate when a transmission should be turned off and are not actually transmitted.

The rate-matched bits for each TTI are then interleaved in accordance with a particular interleaving scheme to provide time diversity (block 322). In accordance with the W-CDMA standard, the interleaving is performed over the TTI, which can be selected as 10 msec, 20 msec, 40 msec, or 80 msec. When the selected TTI is longer than 10 msec, the bits within the TTI are segmented and mapped onto consecutive transport channel frames (block 324). Each transport channel frame corresponds to the portion of the TTI that is to be transmitted over a (10 msec) physical channel radio frame period (or simply, a "frame").

In W-CDMA, data to be transmitted to a particular terminal (or a particular MBMS service) is processed as one or more transport channels at a higher signaling layer. The transport channels are then mapped to one or more physical channels assigned to the terminal (or the MBMS service).

The transport channel frames from all active transport channel processing sections 310 are serially multiplexed into a coded composite transport channel (CCTrCH) (block 332). DTX bits may then be inserted into the multiplexed radio frames such that the number of bits to be transmitted matches the number of available bit positions on one or more "physical channels" to be used for the data transmission (block 334). If more than one physical channel is used, then the bits are segmented among the physical channels (block 336). The bits in each frame for each physical channel are then further interleaved to provide additional time diversity (block 338). The interleaved bits are then mapped to the data portions of their respective physical channels (block 340). The subsequent signal processing to generate a modulated signal suitable for transmission from the base station to the terminal is known in the art and not described herein.

The following terminology and acronyms are used herein:

User equipment (UE)—an entity that includes both a physical terminal equipment and a user identity module or UIM card.

UMTS Terrestrial Radio Access Network (UTRAN)—the access stratum elements of a UMTS network.

Access Stratum (AS)—all network elements and procedures of a cellular system that are influenced by the radio environment (e.g., frequency, cell layout, and so on)

Non Access Stratum (NAS)—all network elements and procedures of a cellular system that are independent of the radio environment (e.g., user authentication procedure, call control procedure, and so on)

Radio access network (RAN)—all network elements that are part of the access stratum (includes the cell, the Node B, and the RNC)

High-speed downlink packet access (HSDPA)—a set of physical channels and procedures defined as part of the UTRAN that enable high speed transmission of data in the downlink.

IP Multimedia Services (IMS)

Session Initiation Protocol (SIP)

Radio Resource Control (RRC)

Public Land Mobile Network (PLMN)

In W-CDMA, services are assigned transport channels, which are logical channels at a higher layer. The transport channels are then mapped to physical channels at a physical layer. The physical channels are defined by various parameters including (1) a specific carrier frequency, (2) a specific scrambling code used to spectrally spread the data prior to transmission, (3) a specific channelization code (if needed) used to channelize the data so that it is orthogonal to the data for other physical channels, (4) specific start and stop times (defining a duration), and (4) on the uplink, a relative phase (0 or $\pi/2$). These various physical channel parameters are described in detail in the applicable W-CDMA standard documents.

The following transport and physical channels defined by W-CDMA are used herein:

BCH—broadcast channel
CCCH—common control channel
DCCH—dedicated control channel
DCH—dedicated channel
DSCH—downlink shared channel
HS-DSCH—high-speed downlink shared channel
HS-SCCH—shared control channel for the HS-DSCH
RACH—random access channel
FACH—forward access channel
DMCH—downlink multicast channel
DPDCH—dedicated physical data channel
DPCCH—dedicated physical control channel
CCPCH—common control physical channel
P-CCPCH—primary common control physical channel
S-CCPCH—secondary common control physical channel
DPCH—dedicated physical channel (which includes the DPDCH and DPCCH)
PDSCH—physical downlink shared channel
HS-PDSCH—high-speed physical downlink shared channel
PRACH—physical random access channel
PDMCH—physical downlink multicast channel
PCPCH—physical common power control channel B. Deployment Scenarios MBMS comprises broadcast and multicast services. A broadcast is a transmission of certain content to a large number of UEs, and a multicast is a transmission of certain content to a specific group of UEs. Because different numbers of UEs are targeted to be served by broadcast and multicast, different considerations related to data processing and transmission apply. Different designs may thus be used for broadcast and multicast.

MBMS is intended to be transmitted to a large number of UEs. MBMS economies of scale rely on the fact that a large number of UEs will be able to receive the same service. Thus, UE capability is an important input parameter in the design of MBMS. In particular, the channel structure and mapping may be selected such that UEs with minimum MBMS capability may be able to receive MBMS services. The minimum MBMS capability is thus an important input for the design of MBMS.

Service Combinations

A communication system may be designed with the capability to support MBMS services along with other services such as voice, packet data, and so on, on a given frequency or carrier. Table 1 lists some combinations of MBMS and other services that may be supported by the communication system on a single carrier.

TABLE 1

| | Services | Requirement |
|---|---|---|
| 1 | Broadcast only, non-registered | UEs cannot be paged |
| 2 | Broadcast only, registered | UEs can be paged |
| 3 | Multicast only, registered | UEs can be paged |
| 4 | MBMS + DCH | Dedicated service (e.g., voice) |
| 5 | MBMS + DCH + DSCH | Dedicated and shared services (e.g., voice and packet data) |
| 6 | MBMS + DCH + HS-DSCH | Dedicated and shared services (e.g., high-speed data packet access (HSDPA)) |

In service combination 1, only broadcast service is supported on the carrier, and the UEs are able to receive the broadcast service without registering with the system. However, without registration, the system does not have knowledge of the UEs' existence. Consequently, the UEs cannot be paged by the system for incoming calls and other services.

In service combination 2, only broadcast service is supported on the carrier, and the UEs are able to receive the broadcast service after registering with the system. Through the registration, the system is provided with knowledge of the UEs' existence, and the UEs can be paged by the system for incoming calls and other services.

In service combination 3, only multicast service is supported on the carrier, and the UEs are able to receive the multicast service after registering with the system. Through the registration, the UEs can thereafter be paged by the system for incoming calls and other services.

In service combination 4, MBMS services and a "dedicated" service are supported on the carrier. The MBMS services may include any combination of broadcast and/or multicast services. The dedicated service may be a voice service or some other service, which may be supported via use of a dedicated channel (DCH) assigned to the UE. The dedicated service is characterized by the allocation of dedicated resources (e.g., a channelization code for a DCH) to the UE for the duration of the communication.

In service combination 5, MBMS services, a dedicated service, and a "shared" service are supported on the carrier. The shared service may be a packet data service or some other service, which may be supported via use of a downlink shared channel (DSCH). The shared service is characterized by the allocation of shared resources to the UE, as needed.

In service combination 6, MBMS services, a dedicated service, and a shared service are supported on the carrier. The shared service may be a high-speed packet data service or some other service, which may be supported via use of a high-speed downlink shared channel (HS-DSCH).

Other service combinations may also be implemented, and this is within the scope of the invention.

For service combinations that only support broadcast, multicast, or MBMS services (e.g., service combinations 1, 2, and 3), the UEs may need to go to other frequencies to obtain other services (e.g., voice, packet data, and so on). Each frequency may be associated with a paging channel used to (1) page the UEs for incoming calls, (2) send system messages to the UEs, and so on.

To ensure that the UEs can be paged, timer-based registration may be implemented. For timer-based registration, if a UE visits a new frequency to receive another service, then it registers with the system for that frequency. Upon registering with the system, the timer for the UE for that frequency is reset. Thereafter, the UE may leave that frequency, go to another frequency for a different service, and return to the same frequency. Upon returning to a prior-visited frequency, the timer maintained for the UE for that frequency is checked. If the timer for the UE has not expired, then registration is not needed and the timer is reset. Timer-based registration may be used to avoid having to re-register with the system each time the UE leaves and returns to the same frequency, which reduces overhead signaling and further improves performance.

Techniques for implementing timer-based registration for a broadcast communication system is described in further detail in U.S. Pat. application Ser. No. 09/933,978, entitled "Method and System for Signaling in Broadcast Communication System," filed Aug. 20, 2001, which is assigned to the assignee of the present application and incorporated herein by reference.

Frequency Allocation

A communication system may be allocated one or more frequency bands that may be used for the downlink. Each frequency band is associated with a carrier signal (or simply, a carrier) at a particular frequency. The carrier is modulated with data to obtain a modulated signal, which may then be transmitted over-the-air on the corresponding frequency band. For W-CDMA, each carrier corresponds to a W-CDMA RAN channel.

MBMS and other services may be supported using various frequency allocation schemes, some of which are described below.

In a first frequency allocation scheme, MBMS and other services are all supported on the same carrier. Different services may be transmitted on different physical channels, as described in further detail below. Since all services are transmitted on the same carrier, the UEs are able to monitor and/or receive different services without having to switch between carriers.

In a second frequency allocation scheme, MBMS and other services are spread across different carriers. This scheme may be used to increase system capacity for these services. The number of UEs receiving MBMS services may be large, and the additional capacity provided by multiple carriers may be used to support MBMS and other services concurrently.

In a third frequency allocation scheme, MBMS and voice services are supported on a first set of one or more carriers, and other services (e.g., packet data) are supported on a second set of one or more carriers. This scheme may be used to bundle services that are likely to be accessed together on the same set of carriers, which may improve accessibility and availability. Since MBMS and voice services are supported on the same set of carriers, a portion of the available resources is used to support voice service, and the remaining resources may be allocated to MBMS services. The resources required to support voice and MBMS services in parallel increase with the number of UEs receiving the service. Since a limited amount of resources may be available for MBMS, the ability to scale MBMS services to meet demands may be impacted.

In a fourth frequency allocation scheme, MBMS services are supported via a separate carrier. This scheme provides the highest level of scalability for MBMS services. However, since MBMS services are on a separate carrier, to receive another service concurrently with MBMS, the UEs would need to process signals from at least two different carriers. This may be achieved using a receiver capable of processing the MBMS services on one carrier and another service on another carrier.

Other frequency allocation schemes may also be used, and this is within the scope of the invention.

For the second, third, and fourth schemes, multiple carriers are used to support various services. The idle mode procedures and hand-over procedures may be designed and adapted in light of MBMS. In particular, the idle mode and hand-over procedures should describe how a UE switches its receiver from one carrier to another as a function of the service selected by the user. When already engaged in either an MBMS session or another call or data session, the procedures should describe how to initiate the parallel reception of the MBMS service and a call or data session, in particular when the MBMS service and the other non-MBMS service are not initially on the same frequency.

C. Channel Structure

MBMS Information Types

Various types of control information and service data may be transmitted to implement MBMS. The control information comprises all information besides service data, as described below. The service data comprises the content (e.g., video, data, and so on) being delivered for MBMS services.

For the downlink, the different types of information for MBMS may be categorized as follows:
System level MBMS information—this information tells the UEs where to look for other MBMS control information and MBMS data. For example, this information may include pointers to MBMS control channels.
Common MBMS control information—this may include NAS and AS MBMS control information (i.e., call related and Access Status related information). The common MBMS control information informs the UEs what services are available, the physical channels on which the services are transmitted, and the parameters for each physical channel used for these services. These parameters may include, for example, the rate, coding, modulation, information type, and so on, used for the physical channel.
Dedicated MBMS control information—this may include NAS and AS MBMS security and/or access control information. This information may include, for example, secret key used for secured processing (which may be dependent on the logical or transport channel to be processed).
MBMS data and control—this includes the MBMS content being broadcast or multicast and other control information. This control information may include, for example, the structure of the coding block and/or parity information for the outer code, as described below.

Different and/or additional types of MBMS control information may also be defined, and this is within the scope of the invention.

For the uplink, different types of information may be transmitted by the UEs to support MBMS. The uplink information for MBMS may be categorized as follows:
Quality feedback information—this may include event driven reporting of quality, power control, and so on.

Channel Structures

The different types of MBMS information may be transmitted using various physical channel structures. In one embodiment, each MBMS information type is transmitted via a respective set of one or more physical channels. A specific channel structure for the downlink MBMS information may be implemented as follows:
System level MBMS information—may be mapped on the BCH/P-CCPCH.
Common MBMS control information—may be mapped on the CCCH/S-CCPCH or DCCH|DPCH or newly defined transport and physical channels.
Dedicated MBMS control information—may be mapped on the DCCH/DPCH.
MBMS data and control—may be mapped on the S-CCPCH and HS-PDSCH or newly defined transport and physical channels.

A specific channel structure for the uplink MBMS information may be implemented as follows:
Quality feedback information—may be mapped on the RACH/PRACH, DCCH/DPCH or newly defined transport and physical channels.

The above channel structure is a specific example. Other channel structures and/or channels may also be defined for MBMS, and this is within the scope of the invention. For example, MBMS data and control may be transmitted on a standalone carrier with different physical layer parameters (e.g., different formats, modulation, multiplexing, and so on) than those currently defined by W-CDMA.

In another embodiment, the different types of MBMS information may be multiplexed together onto a single control channel that may be transmitted to the UEs. The UEs would then recover this control channel and demultiplex the various types of MBMS information to obtain the needed information.

MBMS Signaling

The MBMS control information described above may be categorized into four classes of signaling data:
System specific
Cell specific
Service specific
User specific The MBMS signaling may be mapped on control channels based on various schemes.

In one scheme, the signaling data for each class is mapped on control channels based on the destination for the signaling data. In particular, common control data may be mapped on common channels, and dedicated control data may be mapped on dedicated channels. Furthermore, control data common to all services may be mapped on a service-independent common control channel, and service-specific control data may be multiplexed together with the service data. This scheme may be the most efficient in terms of resource utilization.

In another scheme, the common MBMS control information is sent on the common control channel and also duplicated on the MBMS data channel itself or on the dedicated channel when available. This scheme avoids the need for the UEs to monitor multiple channels in parallel for MBMS. For example, whereas the first scheme would require a UE to receive in parallel two S-CCPCH (one for the common MBMS control information and one for the MBMS service data) and one DPCH (for other services, e.g. voice) to receive MBMS and voice services, the second scheme would require the UE to receive only one S-CCPCH for both MBMS control and service data in addition to the DPCH.

D. Channel Mapping

Channel Multiplexing

MBMS services may be transmitted based on various transmission schemes. In one scheme, each MBMS service is considered as an independent transmission and sent via a separate set of one or more physical channels (i.e., as if it were a separate UE, from the resource allocation perspective). For this scheme, different MBMS services are not multiplexed together at the AS level.

The first scheme provides several advantages. First, it relaxes the requirement on the minimum UE capability needed to receive MBMS services. Second, it offers planning flexibility in terms of MBMS coverage area, power management, and autonomous hand-over procedure. In particular, not all cells need to offer the same MBMS services, and a particular MBMS service may be offered by any designated cells.

In another transmission scheme, multiple MBMS services may be multiplexed together onto the same set of one or more physical channels.

Channel Mapping

Depending on the type of MBMS services, different resource allocation strategies may be considered. An important consideration is whether the resource allocation for MBMS should be semi-static or dynamic.

The semi-static resource allocation scheme may be more robust and efficient with respect to the amount of required signaling. This scheme is well suited for fixed rate MBMS applications (e.g., video, voice, and so on) since the resource has to be allocated on a regular basis to the MBMS service.

The dynamic resource allocation scheme requires signaling overhead to implement but allows for dynamic allocation and re-allocation of the resources. This scheme may be more appropriate for variable rate services such as data transfer.

Both schemes may be evaluated and considered in light of their impact on the access stratum and UE complexity.

MBMS data may be transmitted on various physical channels. The particular physical channel to use and the mapping of the MBMS data to the physical channels may be determined based on various channel mapping schemes. Each channel mapping scheme corresponds to a different resource allocation and transmission strategy. The following channel mapping schemes may be implemented for MBMS:

Semi-static—S-CCPCH model
Hybrid—PDSCH model
Dynamic—HS-PDSCH model

Each of these channel mapping schemes is described in further detail below.

Semi-Static Scheme

In the semi-static scheme, data for a particular MBMS service is transmitted on a physical channel that is allocated and dedicated for that service. The channel allocation is static (or semi-static) and may be identified to the UEs via signaling (e.g., on a broadcast channel). The physical channel may be the S-CCPCH or a similar channel, which includes at least transport format combination indicator (TFCI) and data bits. For MBMS, there is no explicit identification of the UEs to which the data is transmitted.

This channel mapping scheme may be implemented in a straightforward manner. Assuming that the MAC-broadcast is located in the RNC, this scheme would allow for simultaneous reception from neighboring cells by the UEs. Since the MBMS data is transmitted via a pre-defined and known physical channel (dedicated to MBMS data), the UEs monitor this channel in parallel with other physical channels to receive MBMS+voice services or MBMS+voice+data services.

Hybrid Scheme

In the hybrid scheme, for a particular MBMS service, control information for the service is mapped on a common control channel and the associated data for the service is mapped on a shared data channel. For example, the control information may be mapped on the S-CCPCH and the associated service data may be mapped on the PDSCH. A minimum amount of control information (e.g., the TFCI bits, possibly the signaling channel) may be mapped on the common control channel. The hybrid scheme provides some flexibility in the allocation of the channelization code resource in similar manner as the DPCH+PDSCH combination described in Release-99 of the W-CDMA standard. When operating a voice channel in parallel with MBMS service, the TFCI information may be mapped on the DPCCH using a TFCI hard split mode, as described by the W-CDMA standard.

Given that the MAC entity of the shared channel is also located in the RNC, the hybrid scheme is very similar to the semi-static scheme in the sense that the MBMS transmission can be coordinated across multiple cells, which would allow autonomous soft combining of the MBMS data by the terminal (as described below). A main difference is that the hybrid scheme may be more flexible in terms of code allocation, since it allows the MBMS code allocation to be changed every transmission interval without executing a channel re-configuration procedure.

Dynamic Scheme

In the dynamic scheme, MBMS is considered as a best effort data transmission that may be mapped on a HSDPA channel structure. The HSDPA channel structure is a channel structure capable of transmitting data for multiple services (or recipients) using a particular multiplexing scheme. One such HSDPA channel structure is the HDR (high data rate) channel structure that transmits data in a time-division multiplexed (TDM) manner over a single high-speed physical channel. The transmission time for this high-speed physical channel is partitioned into (20 msec) frames, each of which includes 16 (1.67 msec) slots. Each slot may be assigned to a particular service or UE, which may be identified by a field in the frame.

The HDR channel structure includes (1) a mechanism for the UEs to report the quality/condition of the communication channel back to the system so that the data transmission may be adjusted to match the reported channel quality, and (2) a mechanism for reporting incorrectly received (i.e., erased) data packets to facilitate retransmission of these erased packets. The HDR channel structure is described in detail in IS-856.

For W-CDMA, the HS-PDSCH is a physical channel that has many of the attributes of the HDR channel structure, and may thus be used to implement the HSDPA channel structure. HSDPA frames are 2 msec long (3 slots), and each HSDPA frame may be assigned to a particular service or UE. Furthermore, HSDPA allows for code division multiplexing (CDM) partitioning of the code tree. For example, for each HSDPA frame, a certain UE/service may be allocated 3SF=16 codes and another 5 SF=16 codes (the HS-PDSCH channels all use SF=16 codes, where SF denotes the spreading factor for the OVSF code used for the HS-PDSCH). The HS-PDSCH is described in detail in document 3G TS 25.211 v5.0.0.

Using the HSDPA channel structure, different MBMS services may be assigned different UE IDs (H-RNTI) and may be transmitted in a time-division multiplexed manner, possibly along with other services. The different UE IDs allow the UEs actively receiving MBMS to uniquely identify these MBMS services at the physical layer level.

MBMS may be transmitted via the HSDPA channel structure using various allocation schemes. In one scheme, certain frames are allocated for MBMS. This may then reduce the amount of control information since the UEs may be informed once as to where to look for MBMS frames. In another scheme, frames are allocated for MBMS as needed and possibly based on availability. The frames used for MBMS may be signaled to the UEs via an associated control channel, e.g., HS-SCCH.

The UEs may be designed with the capability to receive MBMS services via the HSDPA channel structure. However, in an embodiment, link adaptation is not performed dynamically for broadcast services. This is because broadcast services are transmitted to a large number of UEs and not to a specific UE or a specific set of UEs. Thus, packet-level feedback from the individual UEs would not be required or appropriate, and the UEs do not need to report channel quality information or acknowledgement data.

The UEs may be operated to receive only MBMS services and no other services. In this case, it may not need to operate any dedicated physical channel on both the downlink and uplink to report feedback information. The UEs may also be operated to receive MBMS and non-MBMS services in parallel. In this case, if a particular UE is not able to receive multiple streams for the multiple services in parallel (e.g., over the HS-PDSCH), then the transmissions for these services may be scheduled such that the UE does not have to receive multiple services in the same HSDPA frame.

The HS-PDSCH has a short time duration (2 msec) over which data is interleaved. To improve reliability, the same MBMS data may be redundantly transmitted multiple times to improve the likelihood of proper reception by the UEs at the edge of the cell.

The performance of the MBMS transmission using the HSDPA channel structure may be evaluated and compared against the performance of the semi-static and hybrid schemes. The scheme that results in the best utilization of channel resources may then be selected for use for MBMS.

For W-CDMA, the MAC entity for HS-PDSCH (MAC-hs) is located in the Node B. It is therefore not possible for the MAC entity to coordinate the transmission from multiple cells (except for those managed by the Node B, in which case the cells are the sectors of the Node B) in order to ensure simultaneous reception from neighboring cells based on existing release. However, it may be possible to synchronize the transmission from the RNC side. For example, the RNC may provide the MBMS transport blocks with a certain time stamp that the Node B scheduler would have to obey.

E. Channel Coding and Interleaving

The code rate used for MBMS data may be selected by considering the characteristics of the physical channel used to transmit the MBMS data.

For a point-to-point transmission (e.g., voice), power control is typically used to adjust the transmit power of the transmission so that the desired level of performance (e.g., 1 percent frame error rate) is achieved while minimizing the amount of interference to other transmissions. Power control bits are typically transmitted on the uplink to implement the power control of the downlink transmission.

For a broadcast transmission, the physical channel used for the transmission may be operated without fast power control since that would require too much bandwidth on the uplink to send power control bits from the UEs actively receiving the transmission. If fast power control is not employed, then MBMS data may be coded with a lower code rate to provide improved performance. However, the lower code rate also results in more coded bits, which would require a larger channel bandwidth (or higher data rate) to transmit. The higher channel bandwidth is supported by using a shorter channelization code, which corresponds to a larger portion of the total code resource.

Performance versus code utilization may be evaluated for various operating scenarios. The code rate that "optimizes" performance and code utilization, based on some defined criteria, may then be used for MBMS services.

If the trade-off is positive (i.e., the performance improvement outweighs the higher code utilization), then a low rate code such as a rate 1/5 (R=1/5) code defined by cdma2000 may be used instead of the rate 1/3 (R=1/3) code defined by W-CDMA. Alternatively, the existing rate 1/3 code in W-CDMA may be used in conjunction with repetition (i.e., some or all of the coded data may be repeated to obtain a lower effective code rate). The repetition is less complex to implement. If the trade-off is negative, then the dynamic scheme may not provide the desired level of performance since multiple repetitions of the same data may be needed due to the short channel interleaving span (2 msec) for the HS-PDSCH.

The performance of each of a number of coding/interleaving schemes (e.g., 2 msec+repetition, 10 msec interleaving+repetition, 40 ms interleaving, and 80 msec interleaving) may be evaluated. The scheme that provides the best performance may then be selected for use for MBMS.

F. Error Correction Outer Code

When the number of UEs receiving MBMS service is high, it may not be possible or practical to support MBMS transmission with acknowledgment. An outer code may thus be used for MBMS to enhance link level performance of the downlink physical channel. The outer code corresponds to additional coding that may be performed at a higher layer in addition to the coding performed at the physical layer. The outer code may be implemented (e.g., in software or firmware) in a manner to minimize the impact on the physical layer design. This would then allow the outer code to be implemented in conjunction with existing chip sets that do not support the outer code at the physical layer.

The outer code provides additional error correction capability for MBMS. This is achieved by inserting additional data blocks at regular intervals, which allows the UEs to correct up to a certain number of errors in the frames over which the additional data blocks have been computed. The outer code is beneficial when the errors do not occur in bursts, and therefore the outer code should cover a long transmission time. The time covered by the outer code should also be selected by considering the buffering capability of the UEs and transmission delays.

In an aspect, the outer code is designed with the ability to accommodate variable rate and possibly intermittent transmission. This design would then provide flexibility in the delivery of MBMS services.

The outer code may be implemented based on any linear block code such as a Reed-Solomon code (which is commonly used for data transmission), a Hamming code, a BCH (Bose, Chaudhuri, and Hocquenghem) code, or some other code. In an embodiment, the outer code is implemented with a systematic block code, whereby an encoded data block includes (1) a systematic portion composed of the uncoded data and (2) a parity portion composed of parity bits. The outer code may also be implemented with other types of codes (e.g., CRC, convolutional codes, Turbo codes, and so on), and this is within the scope of the invention.

An (N, K) linear block encoder codes each block of K data symbols (in accordance with a particular set of polynomials if it is a cyclic code) to provide a corresponding codeword of N code symbols. Each symbol comprises one or more bits, with the specific number of bits being dependent on the particular code selected for use. The minimum distance D of the code determines the erasure and error correction capability of the block code, and the code parameters (N, K) determine the memory requirement. It is known that an (N, K) block code can simultaneously correct for T symbol errors and F erasures in a given codeword, where T and F conform to the condition $(2T+F) \leq (D-1)$.

In W-CDMA, services are assigned transport channels, which are logical channels at the higher layer. Each frame of MBMS data is initially composed (or generated) at the higher layer and is designated for transmission over a transmission time interval (TTI). However, a frame may also be defined to be some other unit of data, and this is within the scope of the invention. The TTI corresponds to the time interval over which data for the frame is interleaved. In W-CDMA, a different TTI may be selected for each transport channel. The transport channels at the higher layer are then mapped onto physical channels at the physical layer. Various outer code designs are described below with reference to W-CDMA.

Figure 4A:
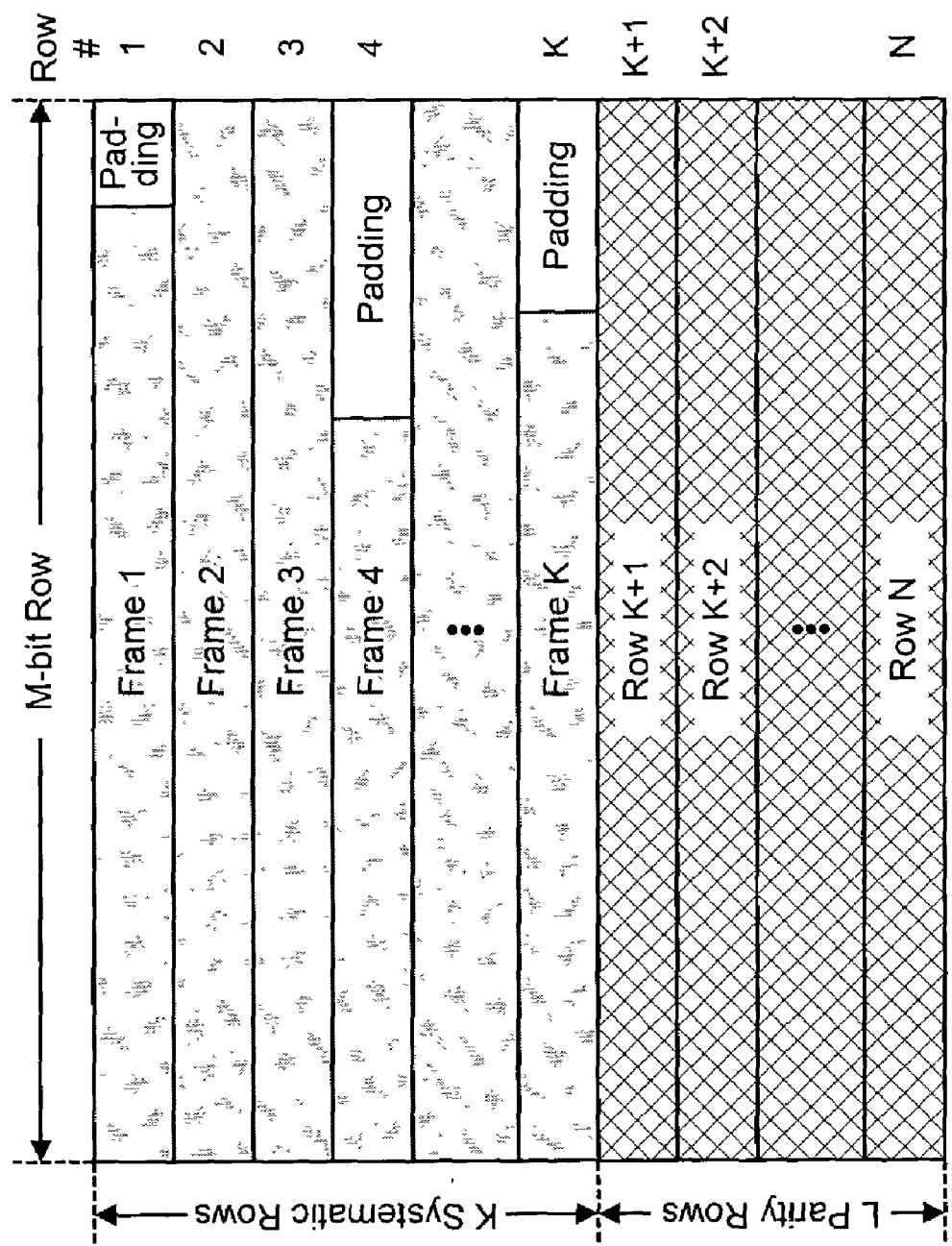
FIGS. 4A through 4F are diagrams illustrating six outer code designs, whereby zero padding is used to facilitate variable-rate outer coding.

FIG. 4A is a diagram illustrating a first outer code design, whereby zero padding is used for each frame to facilitate variable-rate outer coding. The block coding is performed based on a 2-dimensional M×N matrix (or coding block). This matrix is a visual (or logical) representation for the block of data to be coded by the outer code. The matrix may be implemented in a buffer (e.g., memory 232 in FIG. 2). For the first outer code design, M corresponds to the maximum number of bits that may be transmitted in any given frame of MBMS data.

As shown in FIG. 4A, the information bits for the frames are written row by row into the M×N matrix. For this outer code design, each frame of information bits is written to a respective row of the matrix (i.e., one frame per row), and a total of K frames are written to the matrix. If the size of any frame is smaller than M, then the remaining portion of the corresponding row is filled with padding bits, which may be all zeros, all ones, or some other pre-defined or known bit pattern. The padding bits are not transmitted over-the-air on the downlink, and are only used to generate the parity bits.

An outer encoder then generates L additional rows of parity bits based on the K rows of data (which are referred to as systematic rows), where $L=N-K$. For block coding, each column of K symbols in the coding block is coded with a selected (N, K) linear block code to provide a corresponding codeword of N symbols. Depending on the block code selected for use, each symbol may include one or more bits. For a systematic block code, the first K rows in the coding block are the data rows and the remaining (N−K) rows in the coding block are the parity rows generated by the outer block encoder based on the K data rows. Thus, N corresponds to the number of rows in the coding block, which includes both the systematic and parity rows. The K frames of data bits and the L rows of parity bits are sent over-the-air on the downlink.

For W-CDMA, each frame in a coding block is further processed at the physical layer to provide a corresponding coded frame that is then transmitted over-the-air to the UEs. As one of the processing steps at the physical layer, a cyclic redundancy check (CRC) code is generated for each frame based on the information bits for the frame. The CRC code may be used by the UEs to determine whether the frame has been received correctly or in error (i.e., erased).

The outer block decoding at the UEs may be performed with the use of the CRC code transmitted for each row. In particular, each received frame in the coding block may be checked to determine whether it is good or erased. If all K frames in the coding block have been received correctly, then the outer block decoding does not need to be performed and the parity rows may be skipped. If at least one frame in the coding block is erased and can be corrected by the block code, then a sufficient number of parity rows may be received and used in the block decoding to correct the errors in the erased rows. And if the number of erased frames in the coding block is greater than the error correcting capability of the block code, then the block coding may be skipped and an error message may be sent. Alternatively, other techniques may be attempted to block decode the erased frames.

Block coding and decoding are described in further detail in the following U.S. patent applications, which are all assigned to the assignee of the present application and incorporated herein by reference:

Ser. No. 10/010,199 entitled "Erasure-and-Single-Error Correction Decoder for Linear Block Codes," filed Dec. 4, 2001;

Ser. No. 09/933,912, entitled "Method and System for Utilization of an Outer Decoder in a Broadcast Services Communication System," filed Aug. 20, 2001; and Ser. No. 09/976,591, entitled "Method and System for Reduction of Decoding Complexity in a Communication System," filed Oct. 12, 2001.

Figure 4B:
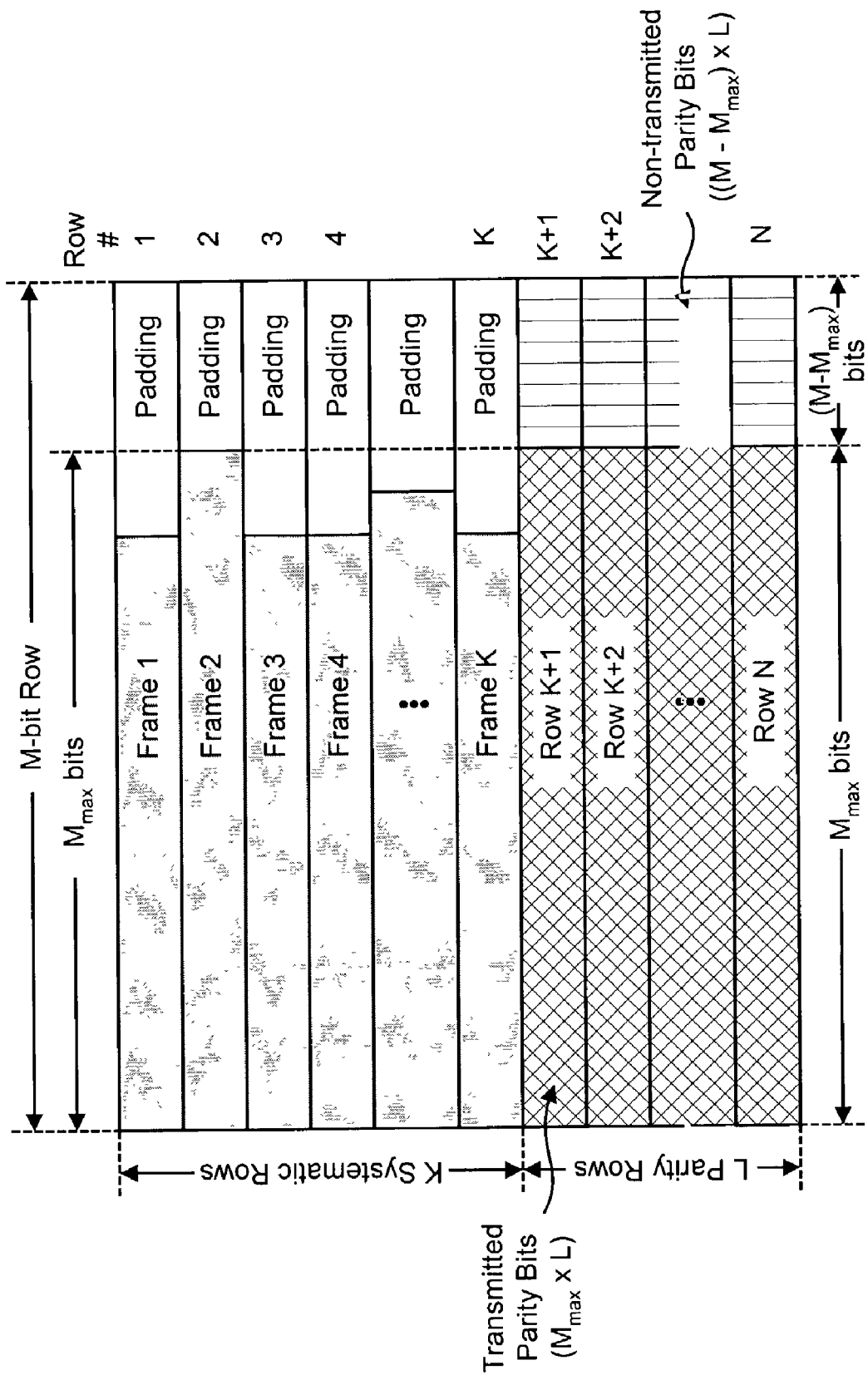

FIG. 4B is a diagram illustrating a second outer code design, whereby zero padding is used for each frame to facilitate variable-rate outer coding and only "useful" parity bits are sent over-the-air on the downlink. For this outer code design, M may be selected based on the maximum number of bits that may be transmitted in a TTI for a given frame of MBMS data. For some coding blocks, each of the K frames in the coding block includes less than M bits (i.e., padding is used for all K frames in the coding block).

As shown in FIG. 4B, the largest frame among the K systematic frames includes $M_{max}$ bits, where $M_{max} < M$. The block coding may be performed column-wise, similar to the first outer code design. However, only the first $M_{max}$ columns include information bits, and the parity bits generated for these information bits may be used for error correction at the UEs. The remaining $M-M_{max}$ columns include padding, and the parity bits are generated based on the padding bits and do not carry any useful information. Thus, for the second outer code design, only $M_{max}$ columns of parity bits (i.e., the left $M_{max} \times L$ portion of parity bits) are transmitted over-the-air, and the remaining $(M-M_{max})$ columns of parity bits (i.e., the right $(M-M_{max}) \times L$ portion of parity bits) are not transmitted.

The first and second outer code designs are well suited for an implementation whereby the MBMS data is mapped onto a dedicated channel (dedicated in the sense that the code resource is constantly allocated to the MBMS service). At the UEs, there is no ambiguity regarding the re-construction of the M×N matrix, since a new frame is received every TTI and written to the corresponding row in the matrix. An ambiguity that may arise relates to the size of each received frame (i.e., the transport block set size, $M_k$), which depends on the instantaneous rate of the frame. Since the error rate of the rate detection should be low (e.g., well below 1%), this ambiguity should not pose an issue.

As shown in FIG. 4B, the ratio of the largest frame size to average frame size may be large. This would then result in a large portion of the M×N matrix being filled with padding bits. In this case, a relatively large number of parity bits may be transmitted for a relatively small number of information bits. This would then result in an inefficient use of the available bits.

Figure 4C:
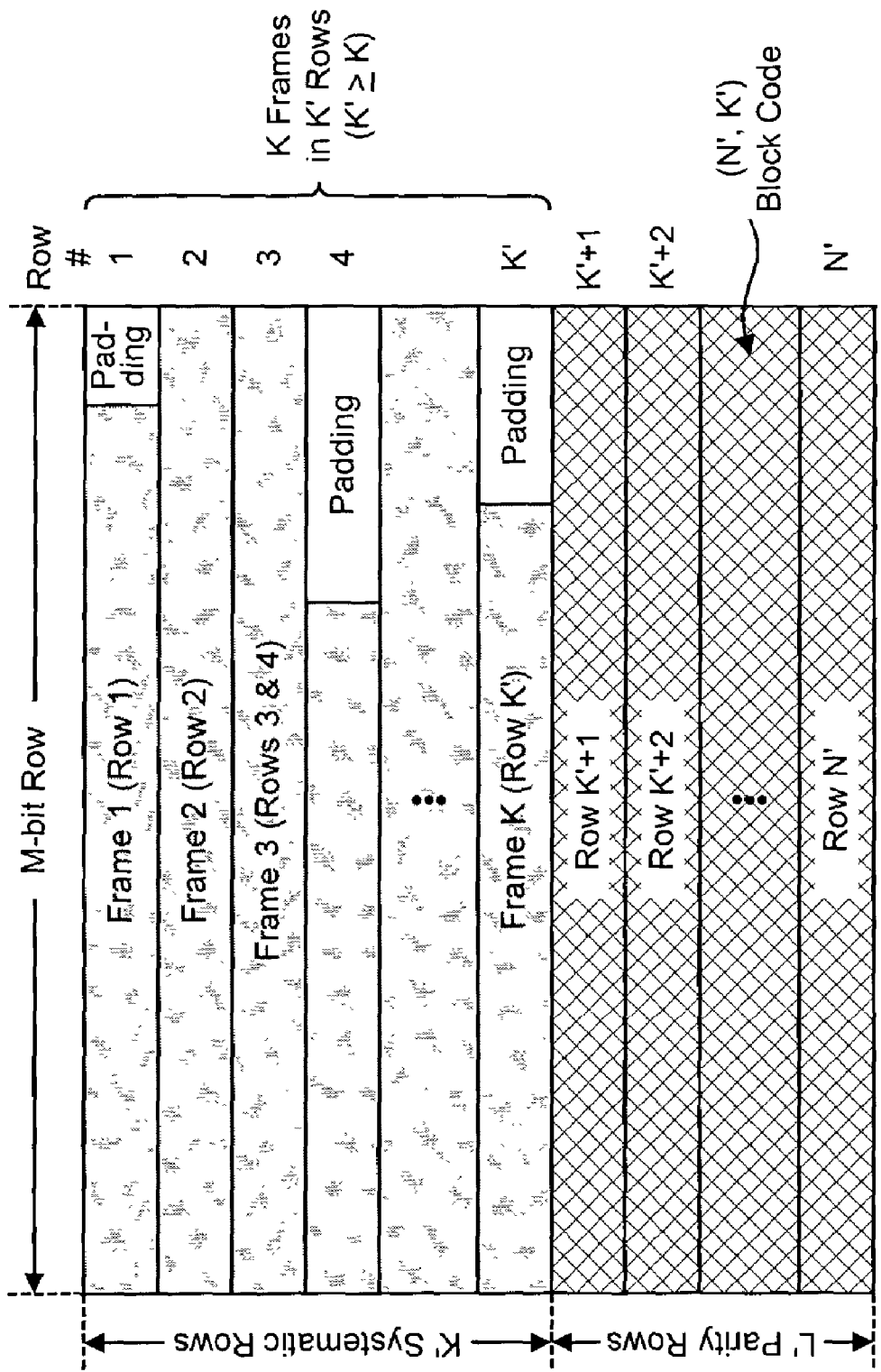

FIG. 4C is a diagram illustrating a third outer code design, whereby a frame may be written to multiple rows of the matrix and the block coding is dependent on the number of systematic rows in the matrix. For this design, the size of the matrix (or more specifically, the number of rows) is variable and dependent on the size of the input frames. For this design, M is selected as a value that may be smaller than $M_{max}$. For example, M may be selected to be equal to the average number of bits per frame instead of the maximum number of bits expected to be received for a frame.

Similar to the first and second outer code designs, the information bits for the frames are written row-by-row into the matrix. Each frame that is larger than M bits is written in multiple consecutive rows of the matrix, in a wrap-around fashion, with the unused portion of the last row being padded so that each frame covers an integer number of rows. As shown in FIG. 4C, frame 3 includes more than M bits and is written to rows 3 and 4, with the unused portion of row 4 being filled with padding bits. For this design, the number of frames transmitted over-the-air for each coding block is constant, and K frames are written to K' rows, where $K' \geq K$.

Block coding is then performed column-wise, similar to the first and second schemes. However, an (N', K') linear block code is used to provide a codeword of N' symbols for each column, where $N' \geq N$. In one embodiment, N' may be selected as $N'=K'+L'$, where $L' \geq L$. In another embodiment, N' may be selected as $N'=K'+L$. If $N'=K'+L$, then the same number of (L) parity bits is used for K' information bits. In this case, if the number of information bits is increased (i.e., K'>K), then the block code is weakened from (N, K) to (N', K').

To account for the weakened block code (i.e., when $K' \geq K$), the transmitter may use higher transmit power for the higher-rate frames (i.e., those frames that span multiple rows). Alternatively, higher transmit power may be used for all frames in the larger-size coding block.

If the higher-rate frames are erased at a UE, then the UE may not know the structure of the coding block (i.e., which frames belong to which rows) without explicit information. The explicit signaling regarding the coding block structure may be sent to the UEs using various mechanisms.

In a first mechanism, explicit signaling is implemented using the TFCI hard split mode defined by W-CDMA. The TFCI is indicative of the set and format of transport blocks multiplexed in a transmission interval. One transport format combination set (TFCS) may be used for the systematic bits and another TFCS may be used for the parity bits. The TFCI would effectively inform the UEs whether data is for the systematic or parity bits. In a second mechanism, one sub-set of the transport format set (TFS) may be used for the systematic bits and another sub-set of the TFS may be used for the parity bits. In a third mechanism, explicit signaling is implemented by using different transport channels for the systematic and parity bits. The TFCI would be different for the transport channels used for the systematic and parity bits. In a fourth mechanism, explicit signaling is implemented with a header in each frame, which indicates whether or not the frame includes systematic or parity bits. In a fifth mechanism, explicit signaling is implemented by defining new slot structures with in-band signaling of the bit category. Other mechanisms for implementing explicit signaling of the coding block structure may also be implemented, and this is within the scope of the invention.

For the third outer code design, the UEs may wrongly detect the transport format for a coding block with one or more wrap-around frames (i.e., K frames in K' rows) to be another transport format for a matrix with no wrap-around frames with a different number of rows (i.e., K frames in K rows). If this happens, then the input data buffer at the UEs may be corrupted and out of synchronization with the data buffer at the network side. To avoid this, the parity bits (or the number of these bits) may be explicitly signaled (e.g., by the network) such that the UEs may be able to re-synchronize its data buffer when such situations occur. The explicit signaling of parity bit information may be performed using any of the mechanisms described above for signaling block structure information.

Figure 4D:
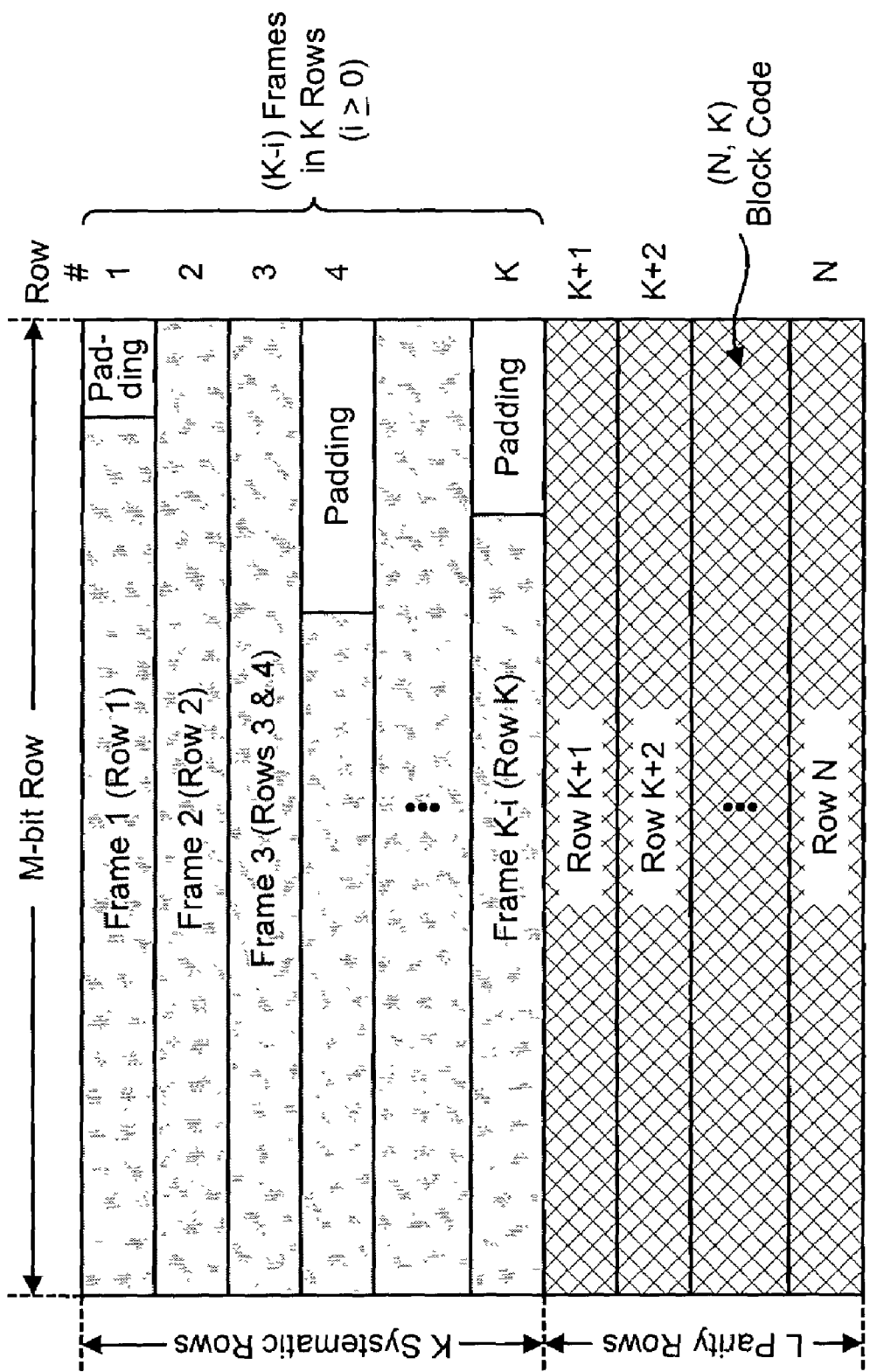

FIG. 4D is a diagram illustrating a fourth outer code design, whereby a frame may be written to multiple rows of the M×N matrix and the same block code is used for each coding block. For this design, the size of the matrix is fixed, and M may also be selected to be smaller than $M_{max}$ (e.g., M=the average number of bits per frame).

Similar to the previous designs, the information bits for the frames are written row-by-row into the matrix. Each frame that is larger than M bits is written in multiple consecutive rows of the M×N matrix, in a wrap-around fashion, with the unused portion of the last row being padded so that each frame covers an integer number of rows. For this design, up to K frames (i.e., K×i frames, where $i \geq 0$) are written to K rows of the matrix. Block coding is then performed column-wise using an (N, K) linear block code to provide a codeword of N symbols for each column. The M×N matrix thus includes M rows of systematic bits and L rows of parity bits.

Similar to the third outer code design, the UEs may wrongly detect the transport format for a coding block with one or more wrap-around frames. If this happens, then the UE input data buffer may be corrupted and out of synchronization with the network data buffer. Explicit signaling regarding the block structure and/or the parity bits may be sent using the various explicit signaling mechanisms described above. In this way, the UEs may be able to re-synchronize its buffer when a mis-detection of the transport format occurs.

Figure 4E:
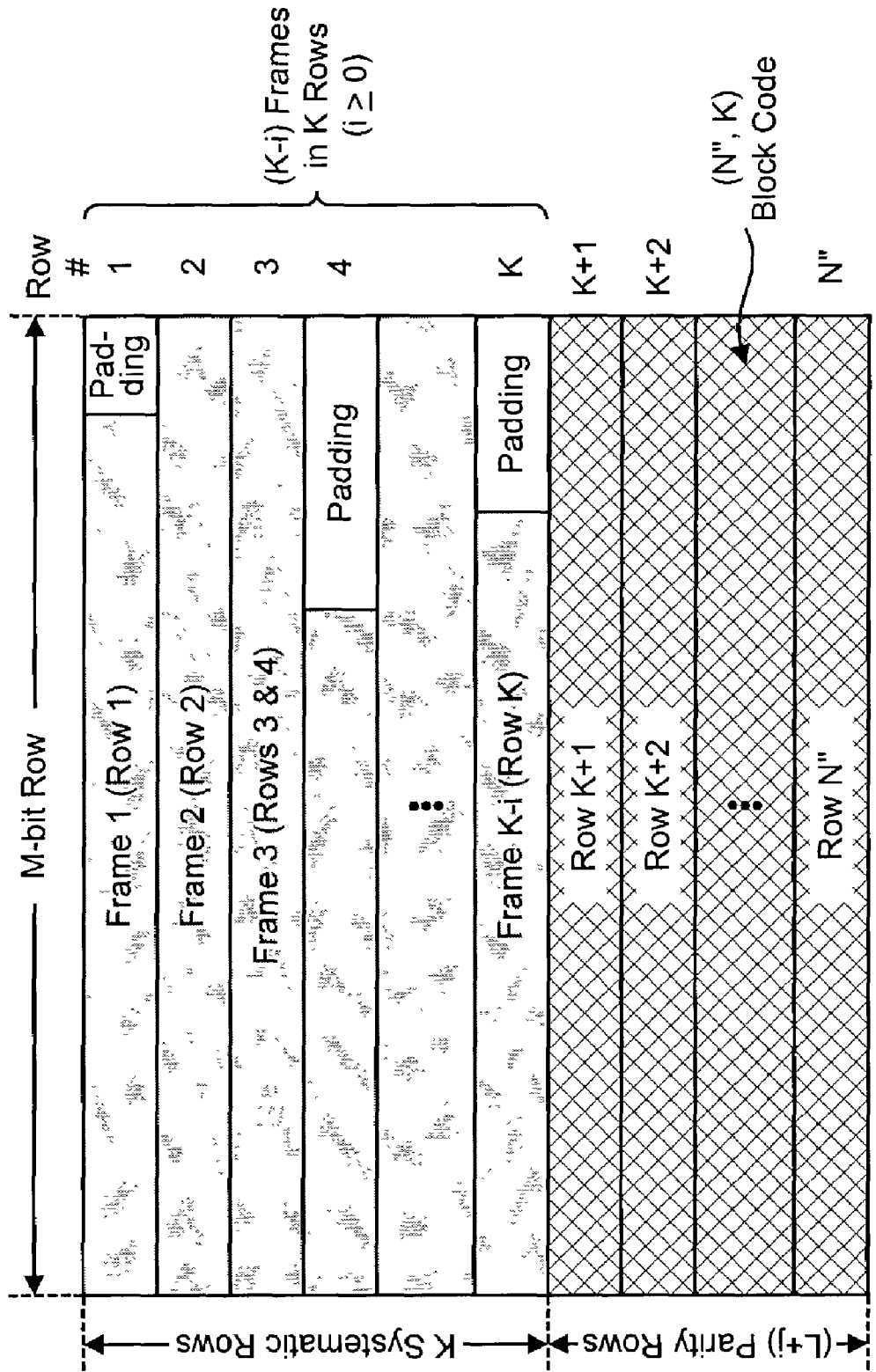

FIG. 4E is a diagram illustrating a fifth outer code design, whereby a frame may be written to multiple rows of the M×N matrix and different block codes may be used depending on the frames in the coding block. For a coding block with frames of varying lengths, higher-rate frames in the coding block may be more prone to erroneous reception (i.e., are associated with higher frame error rates). To ensure similar quality of service (QoS) when more bits are sent for a given frame, more redundancy may be provided for the coding block when there are one or more higher-rate frames in the coding block.

Similar to the other designs described above, the information bits for the frames are written row-by-row into the matrix. Each frame that is larger than M bits is written in multiple consecutive rows of the matrix, in a wrap-around fashion, with the unused portion of the last row being padded so that each frame covers an integer number of rows. For example, frame 4 is written to rows 4 and 5 of the matrix. For this design, up to K frames are written to the K rows in the matrix.

Block coding is then performed column-wise using an (N", K) linear block code to provide a codeword of N" symbols for each column, where N"≧N and N" may be dependent on whether or not the coding block includes one or more larger-sized frames that occupy multiple rows. If none of the frames wraps around, then N" may be selected as N"=N. And if at least one frame wraps around and occupies multiple rows, then N" may be selected as N"=N+j, where j denotes the additional redundancy to ensure similar QoS for the larger-sized frame(s) in the coding block.

The M×N" matrix includes M rows of systematic bits and L+j rows of parity bits, where j≧0. Thus, j extra rows of parity bits are generated. In one embodiment, two possible block codes (N, K) and (N", K) are defined. The (N, K) block code is used if no frames wrap around, and the (N", K) block code is used if at least one frame wraps around. In another embodiment, a set of more than two block codes is defined, and block codes with greater redundancy are used for coding blocks with greater number of larger-sized frames.

In an embodiment, the L+j parity rows are sent one row per frame. In another embodiment, the parity rows may be sent one or more rows per frame For the outer code designs shown in FIGS. 4A through 4E, a variable number of information bits may be written to each row of a matrix (depending on the size of the frame) and the remaining bits in each row are padded. The block coding is then performed column-wise based on a selected block code. As shown in FIGS. 4A through 4E, different number of information bits may be used in the block coding for each column. In particular, the number of information bits per column is likely to decrease toward the right side of the matrix because of the use of padding for smaller-sized frames. Thus, there is an uneven distribution of parity bits to information bits across the columns of the matrix, which may then correspond to different error correcting capabilities for the different columns.

Figure 4F:
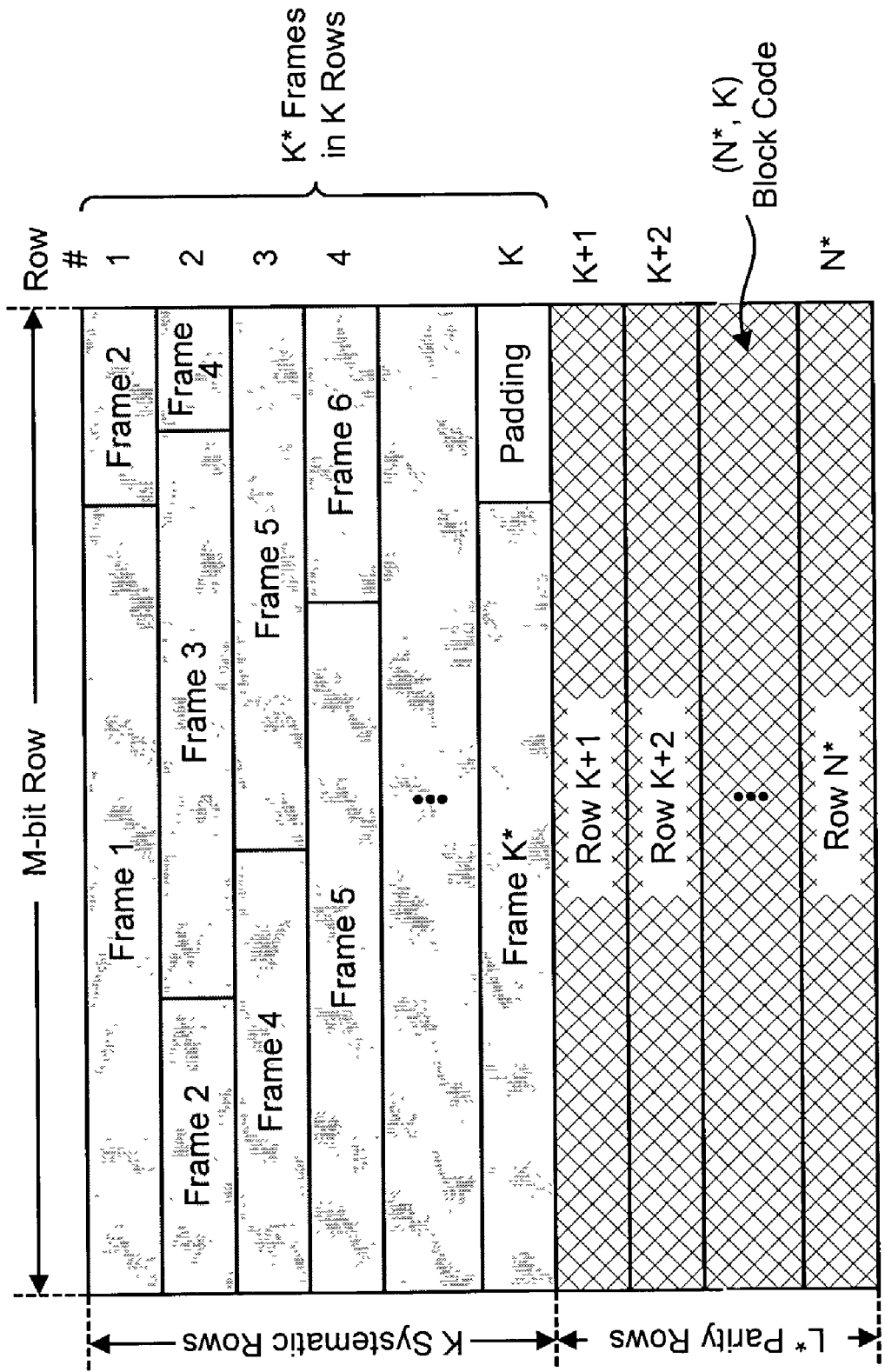

FIG. 4F is a diagram illustrating a sixth outer code design, whereby a frame may be written to one or more rows of an M×N matrix and no padding is used except for the last frame in the matrix.

Similar to the other designs described above, the information bits for the frames are written row-by-row into the matrix, starting at the upper left corner of the matrix. However, no padding is used to fill out the row for each frame. If the frame includes less than M bits, then the information bits for the next frame are written to the next available bit position. For example, frame 1 is written to the first portion of row 1, and frame 2 is written in the remaining portion of row 1 and continuing onto row 2. Conversely, each frame that is larger than M bits may be written in multiple consecutive rows of the matrix, in a wrap-around fashion. For example, frame 5 is written to rows 3 and 4 of the matrix. For this design, K* frames are written to the K rows in the matrix, where K* may be equal to, greater than, or less than K, depending on the size of the frames in the coding block.

Block coding is then performed column-wise using an (N*, K) linear block code to provide a codeword of N* symbols for each column. N* may be selected to be equal to N (i.e., N*=N), or may be dependent on whether or not the coding block includes one or more larger-sized frames that occupy multiple rows.

Explicit signaling regarding the block structure and/or the parity bits may be sent using the various mechanisms described above. This explicit information may be used by the UEs to re-synchronize its input data buffer when a mis-detection of the transport format occurs.

The outer code designs shown in FIGS. 4C-4F provide several advantages. First, these designs allow for the design/selection of an outer code based on average throughput without compromising the ability to handle higher peak rates (by writing a larger-sized frame to multiple rows). Second, these designs allow the network to flush the buffer at any time (e.g., by padding the remaining rows, generating the parity bits, and transmitting the useful systematic and parity bits). For example, the network may flush the buffer in case of buffer under-run due to IP congestion.

G. Power Control

One of the objectives of MBMS services is to make efficient use of the radio resources when transmitting the same content to more than one UE within the same cell. The different types of MBMS services may be differentiated by various factors such as, for example, (1) the size of the audience, which may be related to pricing, (2) the quality of service (QoS) requirements, which may be related to the type of service and pricing, and (3) service traceability, which may be related to access/charging. Some services may be free and thus open to a large number of users. These services may be broadcast services and may include, for example, advertisements, TV channel re-broadcast, weather reports, and so on. Other services may have limited audience and strict QoS requirements. These services are referred to multicast services and may include, for example, pay-per-view movies/sports, group call, and so on.

For broadcast services, a broadcast channel (e.g., the FACH on the S-CCPCH) transmitted at a constant power on the downlink, with occasional RACH transmissions on the uplink, may be sufficient. For multicast services, it may be necessary to implement one or more feedback mechanisms in order to ensure the required QoS. As the number of users decreases, it becomes more efficient to use a dedicated channel (as oppose to a common channel) for multicast service because of the added efficiency of fast power control available for the dedicated channel.

Fast power control of a dedicated channel for a UE on the downlink may be implemented as follows. The dedicated channel is transmitted by the cell at an initial transmit power level that is estimated to be sufficient for reliable reception by the targeted UE. The UE receives the dedicated channel, measures the signal strength of the received dedicated channel and/or some other downlink transmission (e.g., a pilot), compares the received signal strength against a threshold (which is often referred to as a setpoint), and provides an UP command if the received signal strength is less than the setpoint or a DOWN command if the received signal strength is greater than the setpoint. The signal strength may be quantified by a signal-to-noise-and-interference ratio (SNR) or an energy-per-chip-to-total-noise ratio (Ec/Nt) of the pilot and/or some other downlink transmission. The setpoint may be adjusted to achieve a particular desired block error rate (BLER) for the downlink transmission. An UP or DOWN is determined for each power control interval and sent back to the cell, which then adjusts the transmit power of the dedicated channel either up or down accordingly.

A uplink power control mechanism may also be implemented to control the transmit power of the uplink transmission (e.g., the power control commands) sent by the UE. This uplink power control mechanism may be implemented similar to the fast power control mechanism for the downlink dedicated channel, and a transmit power control (TPC) stream may be transmitted to the UE to adjust its uplink transmit power. If fast power control is implemented for multicast service, then power control information may be sent on the downlink to each UE in the group receiving the multicast service to adjust their uplink transmission.

As used herein, a TPC stream may include power control information of any form. For example, a TPC stream may include a stream of power control bits, one bit for each power control interval, with each bit indicating whether an increase (i.e., an UP command) or a decrease (i.e., a DOWN command) in transmit power is desired for the data transmission (or physical channel) being power controlled. Other types of power control commands may also be transmitted, and this is within the scope of the invention. The power control information may also be transmitted in other forms, and this is also within the scope of the invention. For example, the received signal strength (or SNR) at the UE may be reported back to the cells and used for power control. As another example, the maximum rate that may be supported by the communication channel, as estimated at the UE, may be reported back to the cells and used for power control and/or other purposes.

Downlink Physical Channel Models

For a multicast service, the same service data or content is transmitted to a group of UEs. In a straightforward implementation, the service data may be transmitted to each UE using a different physical channel. Even if each such physical channel is individually power controlled, any time there is more than one user, a significant level of duplication exists because the same information is transmitted in parallel to multiple UEs.

In order to avoid this duplication, a radio configuration (RC) that lies in-between a full-fledged broadcasting scheme and the standard dedicated channel scheme may be defined and used for multicast. For this new radio configuration, the power control information may be sent on the uplink by the UEs, in similar manner as for the dedicated channels. However, on the downlink, the service data would be transmitted on a single physical channel and received by all the UEs in the multicast group. A new downlink transport channel may be defined for the transmission of multicast service data and which may be jointly power controlled by a group of UEs. This downlink transport channel is referred to as a downlink multicast channel (DMCH).

The physical channel associated with the DMCH is the physical downlink multicast channel (PDMCH). For a multicast service, a single PDMCH may be set up for all the UEs in the group designated to receive the service. This physical channel may be put in soft hand-over to achieve the same QoS as for other dedicated channels. However, it should be noted that the active set need not be the same for all the UEs in the group. The active set of a particular UE is a list of all cells from which that UE currently receives transmissions. The set of cells from which this physical channel is transmitted is a super-set of all the active sets of the UEs in the corresponding multicast group.

Figure 5A:
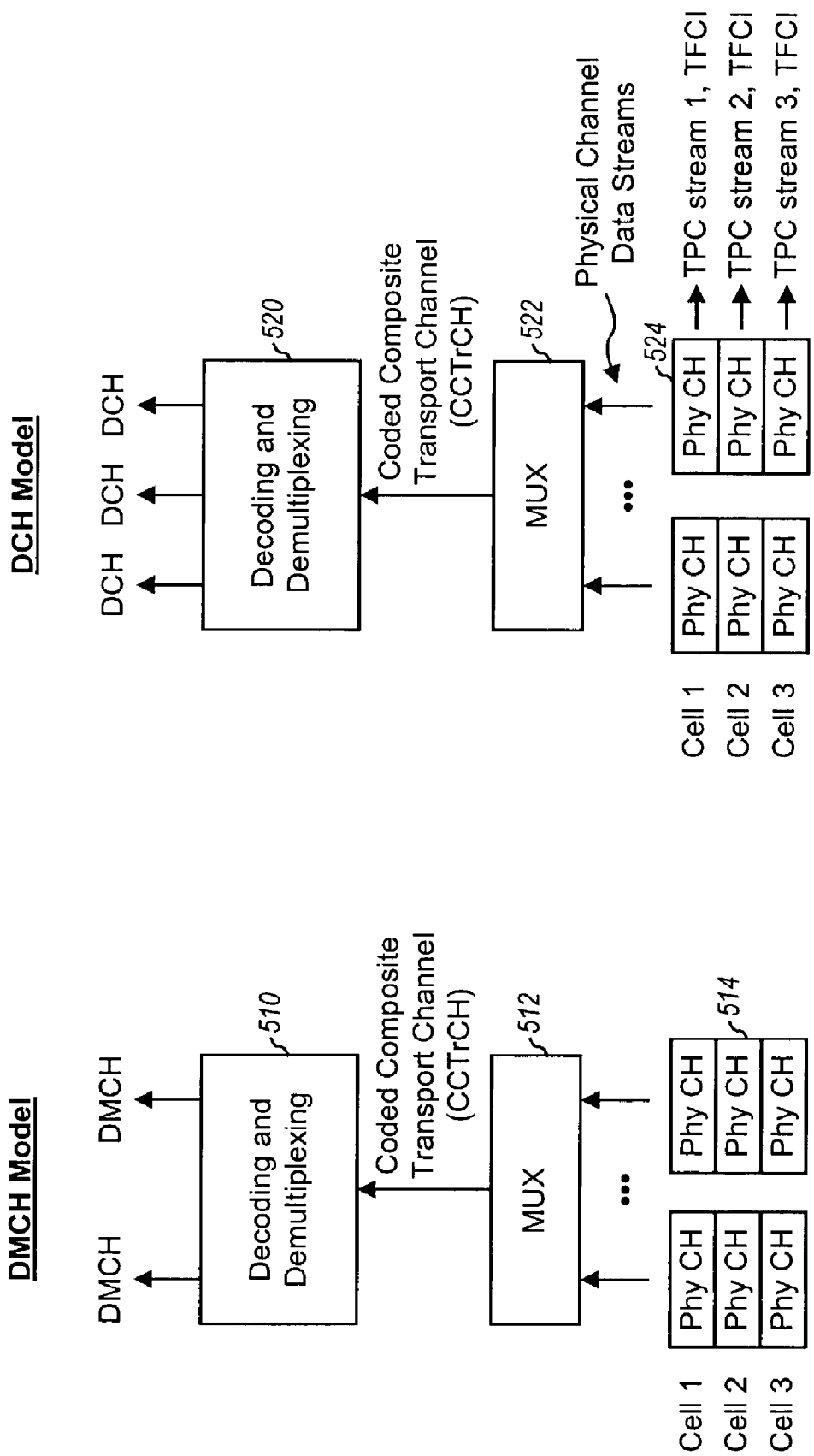
FIGS. 5A through 5C are diagrams illustrating channel models for (1) simultaneous reception of a multicast channel and a dedicated channel at a UE, (2) reception of only a multicast channel, and (3) the dedicated channel on the uplink, respectively.

FIG. 5A is a diagram illustrating a channel model for the simultaneous reception of a multicast channel (DMCH) and a dedicated channel (DCH) at a UE in soft hand-over. The transport channels DMCH and DCH are associated with the physical channels PDMCH and DPCH, respectively.

In this example, the UE is in soft hand-over and receives transmissions from three cells. For the multicast channel, the same service data is transmitted on the PDMCH from all three cells. The PDMCH may be implemented using code division multiplexing (CDM) and may include multiple codes, each of which is represented as a "Phy CH" in FIG. 5A. When multiple codes are used, the CCTrCH is mapped onto multiple DPCHs with same spreading factor. In that case, only the first DPCH carries a DPCCH, and each remaining DPCH includes DTX bits in the DPCCH (and since the DTX bits are not transmitted, only the DPDCH for these remaining DPCHs is transmitted). The data received on the PDMCH from the three cells is multiplexed (block 512) to form a coded composite transport channel (CCTrCH), which is further decoded and demultiplexed (block 510) to provide the decoded data for the one or more transport channels used for the multicast service.

For the dedicated channel, data is transmitted on the DPCH from all three cells. Similarly, the DPCH may be implemented using CDM and may include multiple codes, each of which is also represented as a Phy CH in FIG. 5A. Each cell further transmits on the control portion (DPCCH) of the DPCH (1) a TPC stream used to adjust the transmit power of the uplink transmission from the UE and (2) the TFCI used for the DPCH. The data received on the DPCH from the three cells is multiplexed (block 522) to form a coded composite transport channel, which is further decoded and demultiplexed (block 520) to provide the decoded data for the dedicated channel.

For the dedicated channel, pilot and/or power control information on the DPCCH (e.g., the TPC stream) transmitted by the cell may be processed by the UE to determine the quality of the downlink transmission. This quality information is used to form an (uplink) TPC stream that is transmitted from the UE back to the cell. The cell then adjusts the transmit power of the downlink DPCH transmitted to the UE based on the uplink TPC stream received from the UE.

Correspondingly, the transmit power of the UE is adjusted by the cell to achieve the desired target. Since different cells may received the UE with different quality, different (downlink) TPC streams are used to adjust the transmit power of the UE to the three cells.

In an embodiment, if the UE is simultaneously receiving both the DMCH and DCH on the downlink, then the (uplink) power control information sent on the uplink DPCCH is used to adjust the transmit power of both the PDMCH and DPCH on the downlink, as described in further detail below.

Figure 5B:
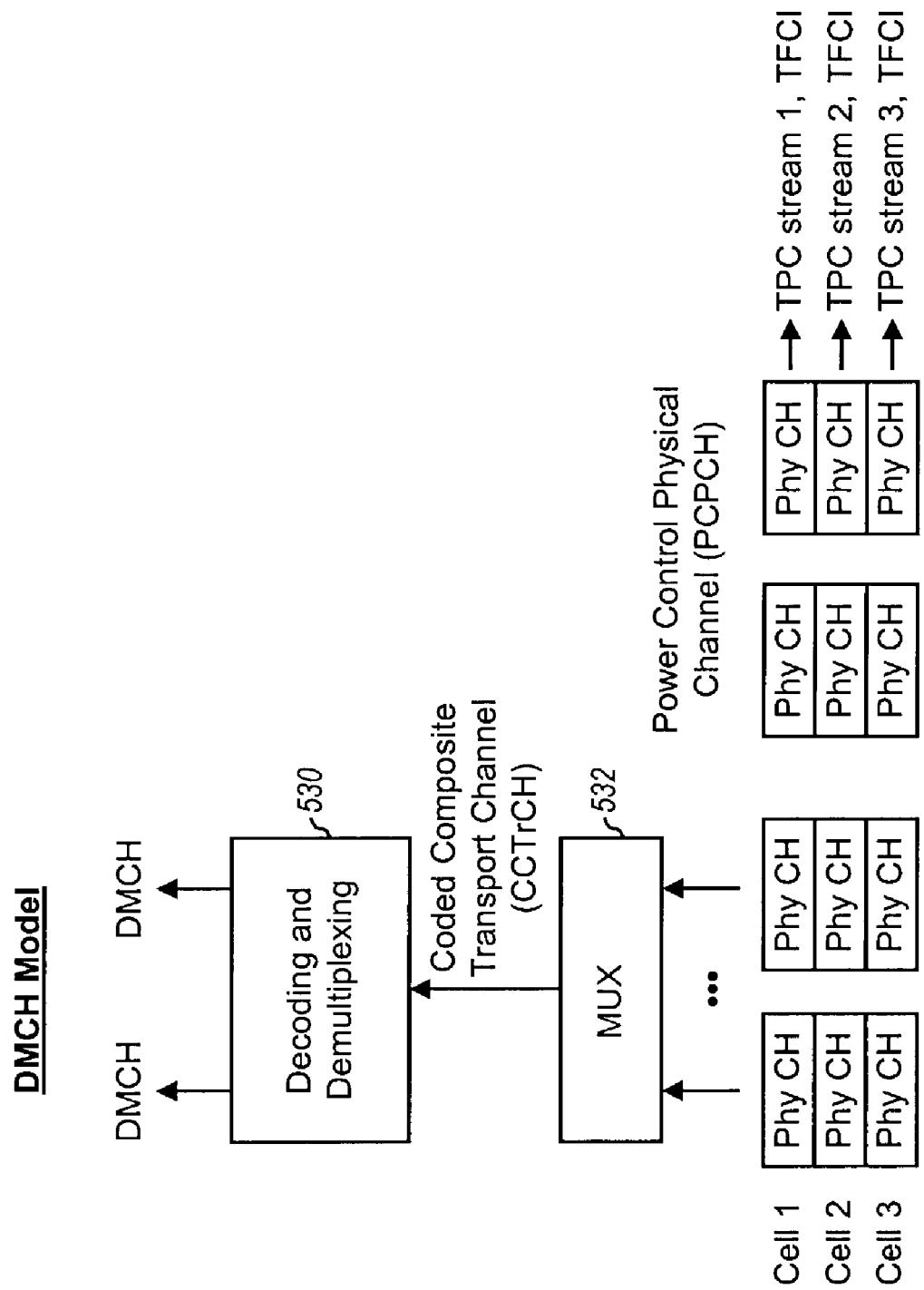

FIG. 5B is a diagram illustrating a channel model for the reception of only a multicast channel (DMCH) at a UE in soft hand-over. In this case, the dedicated information sent on the downlink may only include higher layer signaling and power control. An efficient way to send power control information for multiple UEs using a minimum amount of code space is to time-division-multiplexed the information for these multiple UEs onto the same physical channel, similar to the CPCCH channel used in cdma2000 (IS-2000 Rev A). Since the volume of higher layer signaling is limited, this signaling may be sent on the DMCH. If the signaling/power control is TDM-combined on a single DMCH, then a MAC header may be used to identify the specific UE for which the data is intended. A specific MAC-ID may be used for the multicast data, which is intended for all the UEs in the group.

As shown in FIG. 5B, the UE is in soft hand-over and receives transmissions from three cells. The data received on the PDMCH from the three cells is multiplexed (block 532) to form a coded composite transport channel, which is further decoded and demultiplexed (block 530) to provide the decoded data for the multicast service. In an embodiment, the TPC streams (i.e., the power control information) from the three cells are received on a power control physical channel (PCPCH) in a time-division multiplexed manner. The PCPCH is a new physical channel defined for W-CDMA. This power control information is then used to adjust the uplink transmit power by the UE.

Uplink Physical Channel Models

Figure 5C:
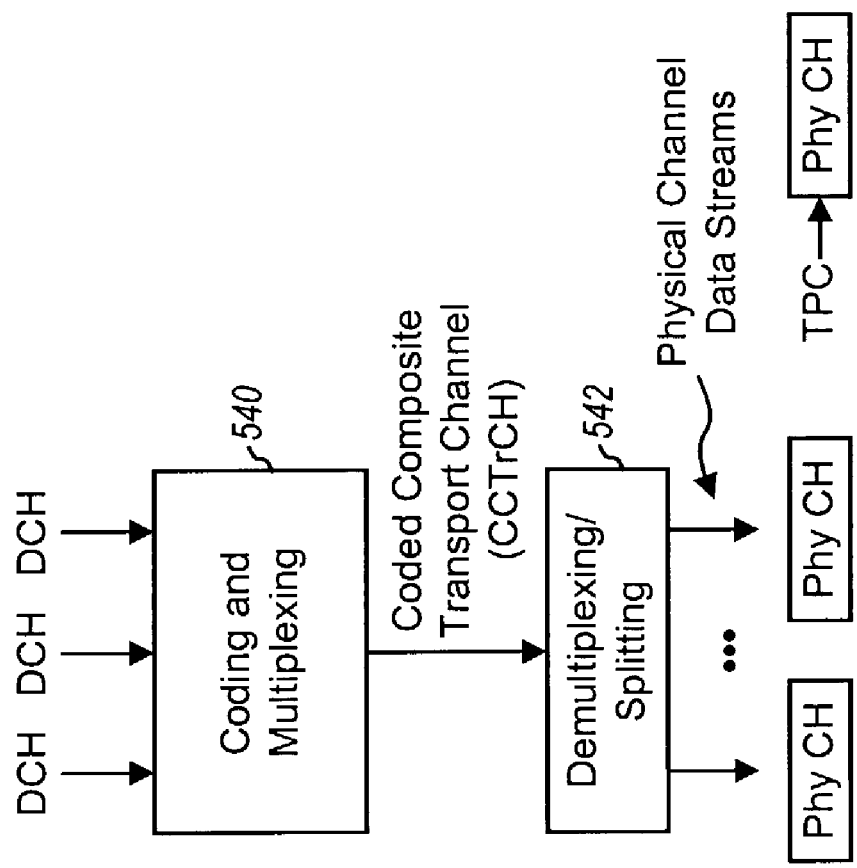

FIG. 5C is a diagram illustrating a channel model for the dedicated channel on the uplink. The physical channel model for the uplink is the same, independent of whether or not a DPCH is used on the downlink. In an embodiment, only one uplink TPC stream is included on the physical channel and used for all the downlink physical channels.

As shown in FIG. 5C, data to be transmitted on the uplink is coded and multiplexed (block 540) to form a coded composite transport channel, which is further demultiplexed and split (block 542) to provide one or more physical channel data streams for one or more physical channels. The uplink TPC stream is also multiplexed on the control portion of the physical channel transmitted from the UE.

Power Control of a Common Channel

The transmit power of a common channel (e.g., the multicast channel) transmitted to a group of UEs may be adjusted to reflect the power requirements of all the UEs in the group. The transmit power for the common channel will then be the envelope of the power requirements of all the UEs in the group. In contrast, the transmit power of the PCPCH or the DPCH (if one is configured) only needs to reach the targeted UE and is adjusted based on this single UE's power requirement. The transmit powers for the common and dedicated channels will thus typically evolve independently.

Various power control schemes may be implemented to adjust the transmit powers of the common and dedicated channels, given that these channels may be associated with different power requirements by the targeted UEs. Some of these schemes are described below. Other schemes may also be implemented, and this is within the scope of the invention.

In a first power control scheme, the transmit powers of the common and dedicated channels are adjusted based on a single TPC stream sent by each targeted UE on the uplink. For this scheme, a single power control command is sent on the uplink for each power control interval for both the common and dedicated channels. For each power control interval, the power control commands for the common channel (PCPCH) and the dedicated channel (PCPCH or DPCH) may each be determined in the normal manner based on the received signal strength and the setpoint for the corresponding channel, as described above. The two power control commands for the two channels may then be combined using the "OR-of-the-UP" commands rule to provide a single (or joint) power control command for the two channels. In particular, the joint power control command is an UP command if any of the channels requires an increase in transmit power. Otherwise, the joint power control command is a DOWN command. Thus, if either of the two channels does not meet its target, the UE would request an increase in transmit power.

For the first scheme, the transmit power of the dedicated physical channel (PCPCH or DPCH) may be determined based directly on the power control command sent by the UE on the uplink, similar to that performed for the regular DPCH. The transmit power for the common channel may be determined as follows.

At the network, a fixed power requirement offset between the dedicated channel (PCPCH or DPCH) and the common channel (PDMCH) for each UE is initially selected. This offset may be dependent on various factors. One such factor is the number of sectors in the UE's active set, which may be used to account for the fact that the power control bits are only transmitted from one cell. The offset for a given UE may thus be selected from multiple available offsets, if the offsets are dependent on the size of the UE's active set. In this case, the offset corresponding to the current active set size of the UE would be selected by the network. Underestimating this offset would only result in transmitting the power control channel (on the PCPCH) at a higher power level than necessary.

Based on this offset and the current value of the transmit power needed for the dedicated channel (PCPCH or DPCH), the transmit power requirement of each user for the common channel (PDMCH) is then determined. The actual transmit power for the common channel by each cell may then be set to the maximum of the transmit powers required by all the UEs that include this cell in their active set. This will then result in the transmit power for the common channel being set equal to the envelope of the transmit powers required by all the UEs.

The fixed power requirement offset between the dedicated and common channels may be initially estimated for each UE such that these channels may be reliably received by the UE. The initial estimate of the offset may not be optimal, and an outer loop may be implemented to adjust this offset. In particular, each UE may adjust the setpoints for the common and dedicated channels such that the target BLERs are achieved for both of these channels. The difference between the two setpoints (e.g., the DMCH setpoint and the PCPCH setpoint) may then be sent to the network, which may then adjust the fixed power requirement offset between the two channels based on the setpoint differences received for all the UEs. Without the offset adjustment via the outer loop, one of the channels would be transmitted at a higher power level than necessary to achieve the required BLER. It should be noted that the offset adjustment (i.e., signaling the outer loop setpoints to the network) may be performed at a slower rate than the outer loop adjustment in order to reduce the amount of signaling.

In a second power control scheme, each UE that concurrently receives the common and dedicated channels transmits two TPC streams, one for the common channel and one for the dedicated channel. Each TPC stream may be derived as described above based on the received signal strength for the corresponding channel and the setpoint for that channel. In one embodiment, the two TPC streams may be transmitted on two power control sub-channels implemented using the TPC field in the DPCCH of the DPCH transmitted by the UE. In another embodiment, the two TPC streams may be transmitted on two power control sub-channels implemented using two TPC fields in the DPCCH. Other means for transmitting the two TPC streams may also be implemented, and this is within the scope of the invention. The transmit power for the dedicated channel (DPCH) may then be adjusted directly based on the TPC stream for that channel. The transmit power for the common channel (PDMCH) may be adjusted based on the TPC streams received from all the UEs designated to receive that channel (e.g., using the "OR-of-the-UP" commands rule described above).

The implementation of multiple power control sub-channels is described in detail in U.S. patent application Ser. No. 09/788,258, entitled "Method and Apparatus for Controlling Transmit Power of Multiple Channels in a CDMA Communication System," filed Feb. 15, 2001, which is assigned to the assignee of the present application and incorporated herein by reference.

Power control for point-to-multipoint services is also described in further detail in U.S. patent application Ser. No. 10/113,257, entitled "Power Control for Point-to-Multipoint Services Provided in Communication Systems," filed Mar. 28, 2002, which is assigned to the assignee of the present application and incorporated herein by reference. Techniques for implementing the outer loop are described in further detail in U.S. patent application Ser. No. 09/933,604, entitled "Power Control for a Channel with Multiple Formats in a Communication System," filed Aug. 20, 2001, which is assigned to the assignee of the present application and incorporated herein by reference.

Hand-over

Because multiple UEs may be in soft-hand-over between different sets of cells, the timing of the PDMCH cannot be modified in order to align the radio-links for any one UE. This architecture may therefore only be used when the network is synchronous or quasi-synchronous.

For simultaneous reception of a multicast channel (PDMCH) and a dedicated channel (DPCH), the active set may be assumed to be the same for both channels. The active set is typically linked to the received energy of the common pilots (Ecp/Nt). Thus, for a given UE, when a DPCH is set up in parallel with the PDMCH, the active set is the same for both channels. The power offset between the two channels may then be derived based on the difference in data rate, QoS, TTI length, and so on, for the two channels. The power offset does not need to be linked to the size of the active set for each channel since they are the same.

Although the active sets are the same for both the common and dedicated channels, it is possible that the transmit power for the PDMCH from the different cells in the active is different. This is because the set of UEs that include these different cells in their active sets are not the same, and thus the transmit powers for these cells will evolve independently. However, because the transmit power for the PDMCH is an envelope of the required powers for the targeted UEs, the power transmitted by each of the cells in a UE's active set will be at least as high as what is required by that UE. Thus, the reliability of the DMCH will likely improve relative to that of the DPCH when the UE is in soft-handoff.

For reception of only a multicast channel, when no DPCH is needed, the only dedicated physical channel received on the downlink are the PCPCHs. These physical channels are sent by each of the cells in the UE's active set. The OVSF code and time offset used for the power control bit sent to the UE by each cell may be configured by higher layer signaling.

Because the PCPCH channels are not soft-combined (due to different power control bits being sent by each cell), the power offset between the PCPCHs channels and the PDMCH may be made a function of the size of the UE's active set. Power offsets such as that used in IS-95 between dedicated channel bits and power control bits (e.g., 0 dB, 3 dB, and 5 dB for no soft hand-over, 2-way soft hand-over, and 3-way soft-hand-over, respectively) may be used for the PCPCHs and PDMCH.

Thus, power control may or may not be used for MBMS transmission, depending on various factors noted above. Fast power control or channel selection may be implemented on a per UE basis if the number of UEs receiving the MBMS transmission is not too large. A group of UEs may jointly power control a physical channel used to transmit MBMS data (i.e., MBMS channel) using, for example, the "OR-of-the-Up" commands rule whereby the transmit power for the MBMS channel is increased if any UE requests an increase.

With joint power control of an MBMS channel, the benefits of fast power control may be greatly reduced as the dynamic range of the joint channel is reduced by statistical averaging. In addition, fast power control requires dedicated downlink and uplink resources. For a broadcast service, the allocation of dedicated resource to each UE actively receiving the MBMS channel may result in very high code and power usage with diminishing benefits as the number of active UEs increases. However, joint power control may be beneficial for a multicast service, which covers a transmission to a smaller number of UEs.

Even when fast power control is not used for the MBMS channel, the UE may report the quality of the MBMS service, which may thereafter be used for various purposes. The reporting may be performed on a statistical basis (e.g., a subset of all UEs may report service quality information), on a per-event basis (e.g., the UEs may report the service quality information when experiencing QoS below a certain threshold), or on demand by the network. The reporting of service quality information is described in further detail below.

H. Measurement/Quality Control

MBMS may be implemented without any closed loop procedure (e.g., no fast power control) to adjust MBMS transmission, except possibly for the RRC related procedures associated with multicast. However, it may still be desirable to monitor the quality of the MBMS services received by the UEs. This service quality information may be used to adjust various processes related to the transmission of MBMS services. For example, the network may adjust the power allocated to a particular broadcast or multicast service to maintain a particular average quality of service in the cell or service area. This would then allow the network to minimize the amount of power allocated to each MBMS service while still ensuring that the grade of service meets the target.

The service quality information may be collected from the UEs using various collection and reporting schemes.

In a first scheme, which is also referred to as command reporting, the UEs are specifically commanded by the network to collect and/or report certain measurements. In general, any number of UEs may be selected to report any measurements. For example, the network may request UEs receiving a particular MBMS service to report a particular measurement (e.g., the transport channel block error rate). The request may be sent to the UEs via signaling. For example, the request may be sent on a transport channel that is multiplexed with the one or more transport channels used for MBMS data to form a coded composite transport channel (CCTrCH).

The reporting may be aperiodic (e.g., based on a schedule) or periodic (e.g., with the reporting interval being provided with the request). The terminal may report the measurements until directed by the network to terminate. The reporting may also be on-demand (i.e., whenever command by the network).

In a second scheme, which is also referred to as statistical reporting, service quality information is collected from a selected group of UEs instead of all UEs. Since there may be a large number of UEs receiving a particular MBMS service, requesting all UEs to report a particular measurement (e.g., block error rate) may result in an excessive amount of overhead traffic associated with the measurement reporting. To reduce overhead traffic, only certain UEs may be selected for reporting. The UEs may be randomly selected, for example, (1) by hashing a particular ID assigned to each UE or user, (2) by comparing a random variable assigned to each UE to a threshold set by the network, or (3) based on some other selection scheme.

In a third scheme, which is also referred to as event-driven reporting, the UEs may be requested to report measurements upon occurrence of certain defined events. All or a subset of UEs may be requested to perform event-driven reporting. Moreover, any measurement may be selected for monitoring, and any threshold may be used to trigger the reporting.

For example, the network may request the UEs to report whenever the error rate averaged over a particular measurement period is above a certain threshold. This would then allow the network to detect that a particular UE is not receiving MBMS service with sufficient quality. The network may then increase the amount of transmit power allocated to this MBMS service. This mechanism is especially suited for multicast services where a group of UEs in a particular location may receive a particular service. Through the event-driven reporting, network resources (i.e., transmit power) may be saved by not transmitting to cover the entire cell.

Other schemes may be implemented to collect service quality information from the UEs, and this is within the scope of the invention. Moreover, any combination of these schemes may be used at any given moment. For example, for a particular MBMS service, a specific group of UEs may be randomly selected for statistical reporting, all UEs receiving the service may be requested to perform event-driven reporting, and those UEs that report may be commanded by the network to collect and/or report the same or additional measurements.

When processing the reported measurements from the UEs, the network may take into account other parameters that may affect the accuracy of the measurements. Such parameters may include, for example, round-trip time, pathloss, network topology, and so on. The network may then selectively discard or retain the reported measurements. For example, for UEs located near the edge of an MBMS coverage area and are likely to experience high error rate as they move away from the last serving cell, their reported measurements may be discarded by the network because the reported measurements may be more likely to be inaccurate because of the higher error rate.

I. Transmission/Reception

Generic Initialization Procedure

Figure 6:
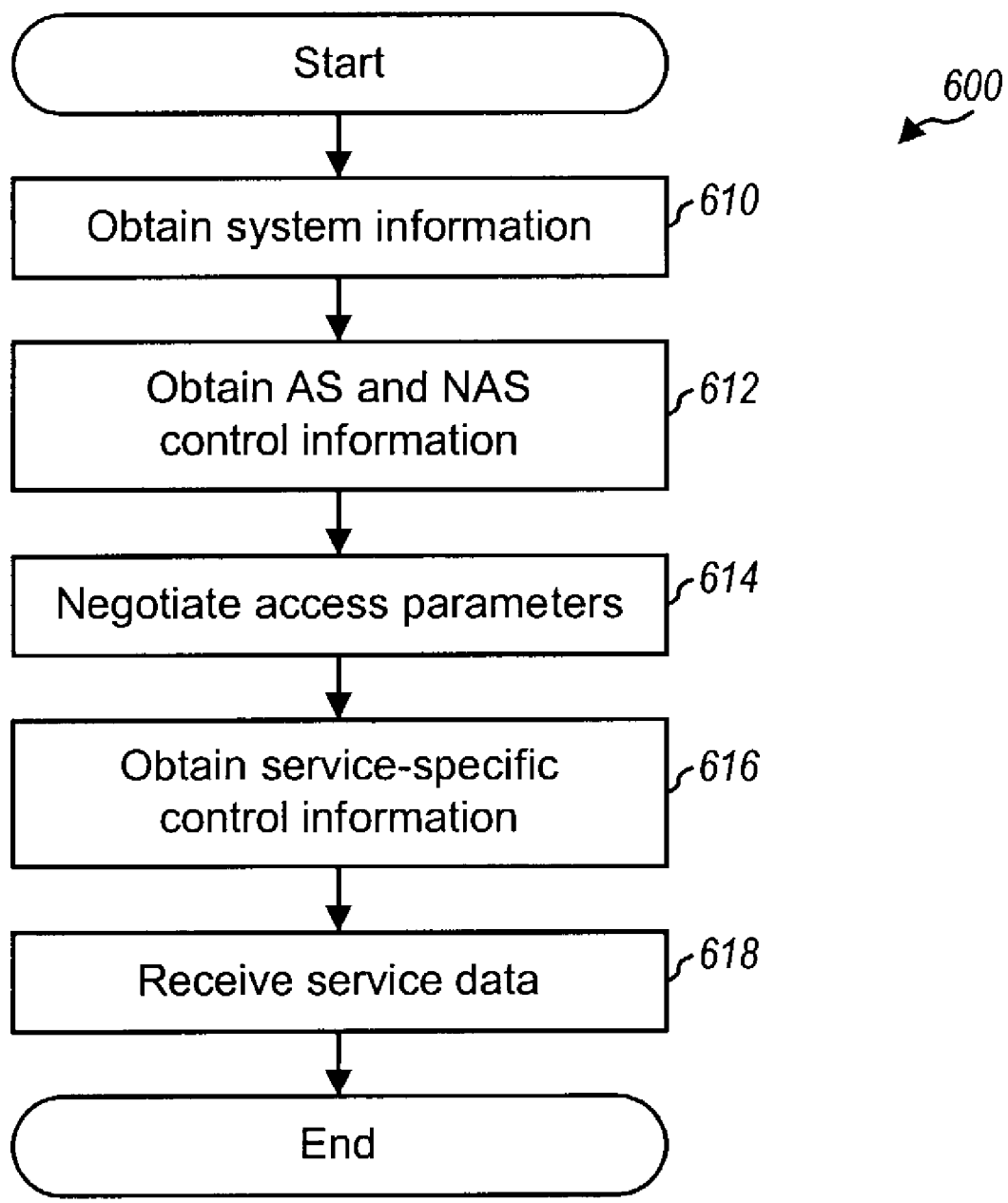
FIG. 6 is a flow diagram of an embodiment of a process for receiving MBMS service by a UE.

FIG. 6 is a flow diagram of an embodiment of a process 600 for receiving MBMS service by a UE. The description for FIG. 6 assumes that the channel structure for MBMS control information and service data described above are used.

Initially, the UE obtains the system level MBMS information by processing system information blocks transmitted over the BCCH (step 610). This system level MBMS information tells the UE where to look for other control information and service data. The UE obtains the AS and NAS MBMS control information from a common MBMS control channel, which may be the S-CCPCH (step 612). This control information informs the UE what services are available, the physical channels on which the services are transmitted, and the parameters for each logical and physical channel used for these services.

Upon obtaining the AS and NAS MBMS control information, the UE may enter into a dedicated mode to negotiate additional access parameters (step 614). The UE may also simply signal that it is starting to receive certain services. Upon completion of the required tasks, the UE receives service-specific control information from the CCCH portion of the physical channel on which the MBMS data is mapped (i.e., the MBMS channel) (step 616). This information may include, for example, the signaling for the outer code.

Upon receiving the service-specific control information, the UE receives the service data on the MBMS channel (step 618). Concurrently, the UE monitors the CCCH portion of this channel for service-specific control information. The UE also monitors the common MBMS control channel for AS and NAS MBMS control information, if this information is not repeated on the MBMS channel or the DCCH when it is present.

For an initial acquisition (which may be performed the first time the UE receives an MBMS service), the UE transitions through all five steps 610 through 618 to obtain the necessary control information. For a subsequent acquisition (which may be performed, for example, when switching to a new MBMS service), the UE may only need to transition through steps 612 through 618 (or just steps 614 through 618).

Other state diagrams may also be implemented, and this is within the scope of the invention.

Cell Coverage

MBMS services may be deployed in existing communication networks with an existing cell layout. The deployment may be such that randomly distributed UEs are able to receive MBMS services across entire cells with a particular quality of service (QoS), although the QoS may not be guaranteed on a per user basis.

To reach the edge of a given cell from a single cell, a large amount of transmit power is typically needed to achieve the desired QoS. Since it is likely that a given MBMS service will cover multiple cells (at least in case of broadcast), the same MBMS data may be transmitted from neighboring cells. Thus, to improve MBMS coverage and reduce the amount of transmit power needed to reach the cell edge, it would be highly advantageous to enable the UEs to combine MBMS transmissions received from multiple cells.

However, MBMS services are mapped on common channels, and mechanisms for performing soft handover are defined for dedicated channels. Thus, it is not possible to establish the common channels in soft hand-over using the currently available mechanisms for soft band-over. If soft hand-over cannot be used for MBMS services, then MBMS coverage may be severely impacted.

Techniques are described herein to allow the UEs to combine MBMS frames from multiple cells to provide improved performance. The type of combining that may be performed at the UEs depends on the level of synchronization among the cells in the network and the buffering capability of the UEs, as described below. In order to limit the signaling load, the combining may be performed without dedicated signaling, which is referred to herein as autonomous soft hand-over.

Autonomous Soft Hand-Over

A UE may be located in a joint coverage area of two or more cells. If these cells transmit the same MBMS data and if the timing for these cells is known, then the UE may be able to receive and process the MBMS data from multiple cells to provide improved performance. For example, the UE may combine frames of the same MBMS data (i.e., "corresponding" MBMS frames) from multiple cells and then decode the combined frames to improve decoding performance. Alternatively, the UE may individually decode the corresponding MBMS frames received from multiple cells (without combining them) and then select one of the decoded frames based on the results of the CRC check.

The transport blocks of MBMS data transmitted from multiple cells should be the same to allow for the combining/selection of frames. In order to allow for finger-level combining (such as in soft hand-over), the transmissions from different cells need to be the same on a per symbol basis and mapped the same way on the CCTrCH. This may be ensured if all the services mapped on a CCTrCH have the same MBMS area. Essentially, the data transmitted needs to be the same at the code symbol level in order to allow for soft combining. One option in MBMS is to multiplex multiple services on a single physical channel. If the services have different coverage areas (i.e., a set of cells in which the service is available), then the requirement to have the exact same data at the physical layer cannot be met in the cells that are not jointly covered by both services.

With autonomous soft hand-over, the UE is able to autonomously determine the cells from which it can receive and combine corresponding MBMS frames without having to exchange signaling with the cells. This signaling is typically required for soft or hard hand-over with other dedicated services such as voice or packet data. Autonomous soft hand-over may be advantageously employed for broadcast services to reduce the amount of overhead signaling for hand-over. Autonomous soft hand-over is also possible because broadcast transmissions are intended to be received by a large number of UEs, and are not adjusted for specific UE.

Autonomous soft hand-over may be implemented if the UE is provided with information regarding the time offset or time difference between the corresponding MBMS frames transmitted from neighboring cells. The time difference between the transmissions from multiple cells to be combined should be within the processing and buffering capability of the UE. Thus, to support autonomous soft hand-over, the extent and level of synchronization among the cells and the minimum capability of the UE may be defined such that the UE is able to combine the signals received from multiple cells for autonomous soft-handover.

For W-CDMA, the cells in the network may be operated synchronously or asynchronously, with the choice of operation being determined by the network operator. The level of synchronization between cells impacts the UE's ability to (1) identify "redundant" frames of MBMS data from multiple cells (i.e., frames that may be combined or selected) and (2) combine or individually process these frames.

The level of cell synchronization may be defined as the time difference between the transmission times of the same MBMS transport block by different cells. For simplicity, the MBMS blocks transmitted from different cells may be assumed to be transmitted over radio frames with the same SFN number. If this assumption is not true or if the SFN of the cells are not synchronized, then an extra identification field and/or a procedure may be implemented by the UE to detect which frames may be combined together. In any case, the UE is able to identify frames of MBMS data that may be combined/selected from the transmissions received from various cells.

Table 2 lists different levels of synchronization among the cells in the network, the means for identifying frames that may be combined, and the techniques (or options) for combining the frames.

TABLE 2

| Synchronization Level | Identification | Combining Options |
|---|---|---|
| Within deskew buffer capability | Implicit | Softer (i.e., soft hand-over) |
| Within 5 msec or half of MBMS TrCH TTI | Implicit | Soft in parallel |
| Within UE soft buffer capability | SFN | Soft in parallel |
| Within UE RLC buffer capability | SFN | Hard (i.e., selection) |
| No synchronization | SFN | None (i.e., hard hand-over) |

As shown in Table 2, the level of synchronization among the cells in the network may be defined based on the capability of various buffers within the UE. The UE typically employs a rake receiver having a number of demodulation elements, which are commonly referred to as fingers. Each finger may be assigned to process a signal instance (or multipath component) of sufficient strength. The multipath components corresponding to the same transmission may be combined prior to decoding. These multipath components may be received from the same cell via multiple signal paths, or may be received from multiple cells. In any case, since the multipath components may have different arrival times at the UE, the outputs from the assigned fingers are provided to a deskew buffer. The deskew buffer properly time-aligns the symbols from the assigned fingers before these symbols are combined.

The UE also typically maintains an RLC buffer used to store data at the RLC layer. The RLC buffer is typically bigger than the deskew buffer and is designated to store a longer time period of data. If a given packet is received in error, then an ARQ signaling may be sent to the network so that the erased packet may be retransmitted. The RLC buffer can thus store a sufficient number of packets to account for the retransmission of the erased packet.

The "soft buffer" is functionally the same as the deskew buffer. However, these buffers may be different in that a different quantization level is selected for each of them (i.e., the number of bits to represent a soft symbol value). These buffers typically also have different sizes, with the soft buffer typically being larger than the deskew buffer.

As also shown in Table 2, the corresponding frames of MBMS data that may be combined/selected may be identified implicitly or based on the SFN. If the time difference between the cells is small, then MBMS frames received from multiple cells within a particular time period (e.g., within half of the MBMS transport channel TTI) may be assumed to be corresponding frames. If the time difference is longer than that, then the SFN of the frame may be used to identify the corresponding MBMS frame.

The combining options listed in Table 2 are described below:

Softer. If the time difference between the transmissions from the multiple cells is sufficiently small, then the combining for soft hand-over may be achieved by adjusting the timing of the deskew buffer at the UE. The transmissions from multiple cells may be assigned different fingers. The outputs from these fingers may be time-aligned by the deskew buffer and then combined. In this way, the transmissions from multiple cells with sufficiently small time difference (i.e., within the capability of the deskew buffer) may be handled in similar manner as the combining performed by the UE for soft hand-over of a dedicated channel.

Soft in Parallel. If the time difference between transmissions from multiple cells exceeds the capability of the deskew buffer, then the transmissions from different cells overlap the deskew buffer and cannot be combined as described above for softer combining. In this case, a different set of fingers may be assigned to process the transmission from each cell. For each cell, the outputs from all fingers assigned to process the transmission from the cell may be combined together. This is equivalent to receiving multiple CCTrCH in parallel. The combined results from the multiple sets of fingers assigned to the multiple cells may then be combined. The combining of the combined results from multiple cells may be performed as if the multiple sets of combined results corresponded to separate transmissions of the same block, similar to that performed in HSDPA.

Various techniques for combing multiple transmissions at the symbol level and the frame level are described in detail in U.S. patent application Ser. No. 10/056,278, entitled "Selective Combining of Multiple Non-Synchronous Transmissions in a Wireless Communication System," filed Jan. 23, 2002, which is assigned to the assignee of the present application and incorporated herein by reference.

Hard. Soft combining is typically not possible if the time difference between the cells exceeds the deskew capability offered by the soft buffer capacity. If the RLC buffer can be used for combining purposes, then it may be possible to emulate an ARQ mechanism in the UE. In particular, if the CRC for an MBMS block does not check or the set of cells to be received is not exhausted, then the UE may decode multiple transmissions from multiple cells in a serial manner, as if they were different transmissions of the same block. If the MBMS transmission is continuous, then this processing scheme is equivalent to having the UE support parallel reception of multiple CCTrCH.

Techniques for performing hard combining is described in further detail in the aforementioned U.S. patent application Ser. No. 10/056,278.

No Cell Synchronization. If there is no guarantee of at least some level of cell synchronization (e.g., if the cells are operated asynchronously), then the UE may not be able to combine MBMS blocks from different cells. This is because the UE would likely not have the memory capacity to absorb the worst-case transmission delay of corresponding MBMS blocks from different cells. In this case, when the UE moves from one cell to another, there may be either a gap or a repetition in MBMS data transmission, as observed at the application layer, depending on the magnitude and sign of the time difference between these cells. If combining is not possible, then the system may transmit MBMS data with higher power to ensure coverage at the cell edge.

Techniques for performing hand-over for broadcast is described in further detail in U.S. patent application Ser. No. 09/933,607, entitled "Method and System for a Handoff in a Broadcast Communication System," filed Aug. 20, 2001, which is assigned to the assignee of the present application and incorporated herein by reference.

J. Signaling

Non Access Stratum (NAS) Signaling

MBMS may use the same signaling architecture defined for IMS. In the NAS, the SIP protocol (or an evolution of the SIP protocol) may be used for all the service related aspects. The NAS signaling may be the same regardless of the air interface used by the Access Stratum (e.g., W-CDMA or GERAN). Some functions of the NAS signaling are as follows:

Service creation—to introduce a new MBMS content or a new multicast group.

Service access—to receive MBMS content or join/leave a multicast group.

Service restrictions—geographic (e.g., which areas carry a specific MBMS content) or user-based (e.g., which subscribers can access a specific content).

Service modification—an audio service may include an optional still image or a video clip.

Service level priorities—some content could pre-empt other content (e.g., emergency announcements have higher priority).

Service notification—to inform users of the MBMS content available in the area.

Quality of Service—to inform user of the available QoS for a specific MBMS content.

Security aspects—user authentication.

Access Stratum (AS) Signaling

AS signaling is specific to the air interface used to deliver the MBMS service. For the W-CDMA air interface, the AS signaling main functions are:

Mapping of the MBMS service to specific radio resources
  Unequal error protection with multiple radio bearers used by the same MBMS content.
  Selection of lower layer retransmission schemes and retransmission parameters.
Handling of user mobility
  Estimate of the number of UEs receiving a specific MBMS content in each cell.
  Use of point-to-point or point-to-multipoint radio bearers.
Reconfiguration of radio resources used for MBMS
  Adaptation of radio resources to changes in the number of UEs in a cell.
  Adaptation of radio resources to changing service requirements (e.g., video, still images).
Quality of Service over radio resources
  Collection of block error rate (BLER) statistics from the UEs in the cell.
  Lower layer retransmission as a function of BLER as perceived by the users in the cell.

Security aspects
    Exchange of ciphering information. This function may optionally be performed at higher layer by the application.
    Support of autonomous soft hand-over procedure on point-to-multipoint radio bearers.
    Delivery of outer code parameters used in point-to-multipoint radio bearers
The messages required to provide the above listed functions may be of two types:
    Point-to-point signaling messages
        Used to configure and maintain the point-to-point radio bearers.
        The already defined DCCH may be used for these messages.
    Point-to-multipoint signaling messages
        Used to configure and maintain the point-to-multipoint radio bearers
        New point-to-multipoint logical channels may be defined for these messages.

Most of the signaling and functions above may be implemented with extensions to the RRC protocol. The point-to-multipoint signaling may require a change in the RRC signaling architecture.

Point-to-multipoint radio bearers are used to provide MBMS content when the amount of resources used by point-to-point radio bearers exceeds a threshold, which may be defined by a network operator. The network operator may also choose to use point-to-multipoint radio bearers if at least one UE that subscribes to MBMS services is in the cell. The decisions as to which radio bearer to use may be dependent on the radio efficiency of the point-to-multipoint solution at the physical layer.

A broadcast address may be used to address all the UEs subscribed to a particular broadcast content. Such a broadcast address may be unique for each broadcast MBMS service offered in the PLMN. Moreover, a global (implicit) address may be used to address all the UEs subscribed to any of the broadcast content offered in the PLMN. Multicast addresses may be used to address UEs involved in a multicast session.

Point-to-multipoint signaling messages may be sent over common transport channels or dedicated transport channels. In general, dedicated transport channels offer greater reliability than common transport channels, but also require more radio resources. Common transport channels reach all the UEs at the same time, but their low reliability typically requires a large amount of retransmissions. A point-to-multipoint signaling message may be periodically retransmitted without interruption. The message may be replaced by a new version of the same message, whenever its content changes. This approach is similar to the transmission of the System Information messages on the BCCH in certain releases of W-CDMA (i.e., R99, Rel-4, and Rel-5)

The mapping of common logical channels (for point-to-multipoint signaling) to dedicated transport channels may be implemented by extending the existing WCDMA signaling architecture. A main drawback of this scheme is that it is not suited to handle a large number of UEs. However, this scheme may be used for the UEs that are simultaneously receiving the MBMS content and are on a dedicated session (voice or data call on dedicated channels). By sending point-to-multipoint signaling messages on a dedicated transport channel (DCH), the UEs would not be forced to receive the common transport channels used only for point-to-multipoint signaling. This scheme would be similar to what is done with the UTRAN Mobility Information message (which can be used in R99, Rel-4, and Rel-5) to inform UEs on the dedicated channels of changes in the system timers.

The point-to-multipoint signaling messages may indicate the configuration or Reconfiguration of point-to-multipoint radio bearers. These signaling messages may include the following information:
    Logical channel information
    Transport channel information
    Physical channel information
    Information on mapping of logical channel to transport channel
    Information on mapping of transport channel to physical channel
    Outer code information
    Autonomous soft hand-over information
    Ciphering information (if a broadcast or multicast key is used)
    Cryptosync information (to align the cryptosync used by the UE, e.g., the HFN)

Of the above enumerated information, only the outer code information, the autonomous soft hand-over information, the ciphering information, and the cryptosync information are new with respect to the existing W-CDMA signaling architecture.

A point-to-multipoint message may indicate if the outer code is used or not. If the outer code is used, then the message identifies the type of code being used, the depth of the interleaver (size of the coding blocks), the phase of the reference coding block, and so on. The phase may be referenced to the SFN used on the common channel of each cell. If the network supports autonomous soft hand-over, then the phase of the reference coding block may be indicated for each of the neighboring cells that are transmitting the same point-to-point radio bearer.

A point-to-multipoint message may also indicate if autonomous soft hand-over is supported or not.

Techniques to implement signaling for broadcast is described in further detail in the aforementioned U.S. patent application Ser. No. 09/933,978.

K. Other Cell/Frequency Measurements

While receiving MBMS services, the UEs should be able to perform measurements on other cells and possibly other frequencies depending on its baseline state (e.g., idle, URA_PCH, CELL_PCH, and so on). The MBMS transmission may be continuous when active. In this case, special procedures may be defined to allow for measurement on other cells and other frequencies.

If the TTI of the MBMS transport channel is long (e.g., 80 msec), then using a portion of this TTI (e.g., 5 msec) to monitor other cells/frequencies may not significantly degrade performance. Depending on the rate of the other cell/frequency measurements and the desired error rate on the MBMS transport channel, losing an MBMS block every now and then while performing the measurement may be acceptable from the perspective of the application. If other services are received in parallel on the DPCH along with MBMS, then this may be the only solution that may be used with a single receiver since the compressed mode patterns (described below) are not the same for all DPCH in the cell.

If a UE has two receivers, then one receiver may be used to perform other cell/frequency measurements and the other receiver may be used to receive MBMS data. The dual receiver architecture is optional for Rel-5 and older releases of the W-CDMA standard. However, the dual receiver may be made mandatory in newer releases of the W-CDMA.

W-CDMA supports a "compressed mode" of operation on the downlink whereby data is transmitted to the UE within a shortened time duration (i.e., compressed in time). The compressed mode is used to allow the UE to temporarily leave the system in order to perform measurements on a different frequency and/or a different Radio Access Technology (RAT) without losing data from the system. In the compressed mode, data is transmitted to the UE during only a portion of a (10 msec) frame so that the remaining portion of the frame (referred to as a transmission gap) may be used by the terminal to perform the measurements.

In the compressed mode, data is transmitted in accordance with a transmission gap pattern sequence (i.e., a compressed mode pattern), which is made up of two alternating transmission gap patterns. Each transmission gap pattern comprises a series of one or more compressed frames followed by zero or more non-compressed frames.

The system may thus set up a compressed mode pattern similar to that for the DPCH. This pattern may be made known to all UEs receiving the MBMS transport channel. This solution may not be practical when a UE receives both voice and MBMS in parallel. If only a fraction of voice users operate MBMS in parallel, then it may be possible to align their compressed mode pattern with the one used for the MBMS channel. However this approach is only applicable for a few users. If all users were to use the same compressed mode pattern, then the system would experience power outages around every transmission gap.

The techniques described herein for implementing MBMS in a wireless communication system may be implemented by various means. For example, various elements of these techniques may be implemented in hardware, software, or a combination thereof. For a hardware implementation, the elements of these techniques may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

For a software implementation, the elements of these techniques may be implemented with modules (e.g., procedures, functions, and so on) that perform the functions described herein. The software codes may be stored in a memory unit (e.g., memories 232 and 262 in FIG. 2) and executed by a processor (e.g., controllers 230 and 260 in FIG. 2). The memory units may be implemented within the processor or external to the processor, in which case they may be communicatively coupled to the processor via various means as is known in the art.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. In a wireless communication system, a method for processing data for transmission to a plurality of terminals, comprising:
   providing a plurality of frames of information bits to a buffer implementing a matrix, wherein the frames may have variable rates and each frame may include a particular number of information bits that is different from those of other frames provided to the matrix;
   padding the matrix with padding bits based on a particular padding scheme; and
   coding the plurality of frames of information bits based on a particular code to provide a plurality of parity bits, and wherein the frames of information bits and the parity bits are transmitted to the plurality of terminals;
   wherein one frame is provided to each row of the matrix, and wherein an unused portion of each row is padded with padding bits;
   wherein each row of the matrix has a size M corresponding to less than a maximum number of information bits expected to be received for a frame.

2. The method of claim 1, wherein each row of the matrix has a size M corresponding to a maximum number of information bits expected to be received for a frame.

3. The method of claim 1, wherein each row of the matrix has a size M corresponding to an average number of information bits expected to be received for a frame.

4. The method of claim 1, wherein the matrix includes a fixed number of frames of information bits.

5. The method of claim 4, wherein the particular code used to code the plurality of frames in the matrix is selected based on a particular number of rows of information bits in the matrix.

6. The method of claim 1, wherein each matrix includes a fixed number of rows of information bits.

7. The method of claim 6, wherein the particular code used to code the plurality of frames in the matrix is selected based on a particular number of frames occupying multiple rows in the matrix.

8. The method of claim 1, wherein the plurality of frames are provided to the matrix without padding, and wherein only an unused portion of a last row of information bits is padded with padding bits.

9. The method of claim 1, wherein the plurality of frames are coded code column-wise in the matrix with a block.

10. The method of claim 9, wherein the block code is a linear block code.

11. The method of claim 9, wherein the block code is a systematic block code.

12. The method of claim 9, wherein only parity bits in columns of the matrix having information bits are transmitted to the plurality of terminals.

13. The method of claim 1, further comprising:
    transmitting information indicative of a structure of the matrix to the plurality of terminals.

* * * * *